US009722041B2

(12) United States Patent
Xu et al.

(10) Patent No.: US 9,722,041 B2
(45) Date of Patent: Aug. 1, 2017

(54) BREAKDOWN VOLTAGE BLOCKING DEVICE

(71) Applicant: Vishay-Siliconix, Santa Clara, CA (US)

(72) Inventors: Robert Q. Xu, Fremont, CA (US); Qufei Chen, San Jose, CA (US)

(73) Assignee: Vishay-Siliconix, Santa Clara, CA (US)

( * ) Notice: Subject to any disclaimer, the term of this patent is extended or adjusted under 35 U.S.C. 154(b) by 102 days.

(21) Appl. No.: 13/622,997

(22) Filed: Sep. 19, 2012

(65) Prior Publication Data

US 2014/0077287 A1    Mar. 20, 2014

(51) Int. Cl.
| | |
|---|---|
| *H01L 29/72* | (2006.01) |
| *H01L 29/66* | (2006.01) |
| *H01L 29/739* | (2006.01) |
| *H01L 29/78* | (2006.01) |
| *H01L 29/40* | (2006.01) |
| *H01L 29/861* | (2006.01) |
| *H01L 29/872* | (2006.01) |
| *H01L 29/423* | (2006.01) |

(52) U.S. Cl.
CPC ...... *H01L 29/66356* (2013.01); *H01L 29/407* (2013.01); *H01L 29/66143* (2013.01); *H01L 29/66643* (2013.01); *H01L 29/66666* (2013.01); *H01L 29/7391* (2013.01); *H01L 29/7828* (2013.01); *H01L 29/7839* (2013.01); *H01L 29/8613* (2013.01); *H01L 29/8725* (2013.01); *H01L 29/4236* (2013.01)

(58) Field of Classification Search
CPC .................................................. H01L 29/7813
USPC ........................................................ 257/328
See application file for complete search history.

(56) References Cited

U.S. PATENT DOCUMENTS

| | | |
|---|---|---|
| 3,165,369 A | 1/1965 | Maston |
| 3,328,210 A | 6/1967 | McCaldin et al. |
| | (Continued) | |

FOREIGN PATENT DOCUMENTS

| | | |
|---|---|---|
| DE | 2933455 | 3/1980 |
| DE | 4208695 | 9/1992 |
| | (Continued) | |

OTHER PUBLICATIONS

Matsushita et al., "Highly Reliable High-Voltage Transistors by Use of the SIPOS Process", IEEE Transactions on Electron Devices, vol. Ed-23, No. 8, Aug. 1976, pp. 826-830.

(Continued)

*Primary Examiner* — John P Dulka

(57) ABSTRACT

In one embodiment, a breakdown voltage blocking device can include an epitaxial region located above a substrate and a plurality of source trenches formed in the epitaxial region. Each source trench can include a dielectric layer surrounding a conductive region. The breakdown voltage blocking device can also include a contact region located in an upper surface of the epitaxial region along with a gate trench formed in the epitaxial region. The gate trench can include a dielectric layer that lines the sidewalls and bottom of the gate trench and a conductive region located between the dielectric layer. The breakdown voltage blocking device can include source metal located above the plurality of source trenches and the contact region. The breakdown voltage blocking device can include gate metal located above the gate trench.

20 Claims, 24 Drawing Sheets

(56) References Cited

U.S. PATENT DOCUMENTS

| | | |
|---|---|---|
| 3,725,844 A | 4/1973 | McKeown et al. |
| 3,727,172 A | 4/1973 | Clark |
| 3,906,540 A | 9/1975 | Hollins |
| 4,082,398 A | 4/1978 | Bourdon et al. |
| 4,119,440 A | 10/1978 | Hile |
| 4,157,806 A | 6/1979 | Bourdon et al. |
| 4,284,997 A | 8/1981 | Nishizawa |
| 4,356,040 A | 10/1982 | Fu et al. |
| 4,356,626 A | 11/1982 | Waghorn |
| 4,366,495 A | 12/1982 | Goodman et al. |
| 4,375,124 A | 3/1983 | Cogan |
| 4,376,286 A | 3/1983 | Lidow et al. |
| 4,403,395 A | 9/1983 | Curran |
| 4,466,839 A | 8/1984 | Dathe et al. |
| 4,481,706 A | 11/1984 | Roche |
| 4,587,712 A | 5/1986 | Baliga |
| 4,590,664 A | 5/1986 | Prentice et al. |
| 4,593,302 A | 6/1986 | Lidow et al. |
| 4,601,760 A | 7/1986 | Hemmah et al. |
| 4,628,341 A | 12/1986 | Thomas |
| 4,641,174 A | 2/1987 | Baliga |
| 4,642,666 A | 2/1987 | Lidow et al. |
| 4,680,853 A | 7/1987 | Lidow et al. |
| 4,705,759 A | 11/1987 | Lidow et al. |
| 4,795,716 A | 1/1989 | Yilmaz et al. |
| 4,799,095 A | 1/1989 | Baliga |
| 4,823,172 A | 4/1989 | Mihara |
| 4,826,780 A | 5/1989 | Takemoto et al. |
| 4,827,321 A | 5/1989 | Baliga |
| 4,827,324 A | 5/1989 | Blanchard |
| 4,855,244 A | 8/1989 | Hutter et al. |
| 4,862,233 A | 8/1989 | Matsushita et al. |
| 4,887,142 A | 12/1989 | Bertotti et al. |
| 4,928,155 A | 5/1990 | Nakagawa et al. |
| 4,967,243 A | 10/1990 | Baliga et al. |
| 4,969,027 A | 11/1990 | Baliga et al. |
| 5,001,073 A | 3/1991 | Huie |
| 5,021,840 A | 6/1991 | Morris |
| 5,053,838 A | 10/1991 | Fujihira |
| 5,072,266 A | 12/1991 | Bulucea et al. |
| 5,091,760 A | 2/1992 | Maeda et al. |
| 5,111,253 A | 5/1992 | Korman et al. |
| 5,156,989 A | 10/1992 | Williams et al. |
| 5,168,331 A | 12/1992 | Yilmaz |
| 5,171,699 A | 12/1992 | Hutter et al. |
| 5,179,432 A | 1/1993 | Husher |
| 5,191,395 A | 3/1993 | Nishimura |
| 5,221,850 A | 6/1993 | Sakurai |
| 5,229,634 A | 7/1993 | Yoshioka et al. |
| 5,243,214 A | 9/1993 | Sin et al. |
| 5,260,228 A | 11/1993 | Taguchi |
| 5,262,345 A | 11/1993 | Nasser |
| 5,281,544 A | 1/1994 | Higuchi |
| 5,288,652 A | 2/1994 | Wang et al. |
| 5,328,859 A | 7/1994 | Vo et al. |
| 5,364,802 A | 11/1994 | Kataoka et al. |
| 5,541,123 A | 7/1996 | Williams et al. |
| 5,621,234 A | 4/1997 | Kato |
| 5,689,128 A | 11/1997 | Hshieh et al. |
| 5,696,396 A | 12/1997 | Tokura et al. |
| 5,766,966 A | 6/1998 | Ng |
| 5,814,858 A | 9/1998 | Williams |
| 5,939,752 A | 8/1999 | Williams |
| 5,998,837 A | 12/1999 | Williams |
| 6,040,600 A | 3/2000 | Uenishi et al. |
| 6,140,679 A | 10/2000 | Ferla et al. |
| 6,621,122 B2 | 9/2003 | Qu |
| 6,768,170 B2 | 7/2004 | Zhou |
| 7,492,003 B2 | 2/2009 | Kinzer |
| 9,166,015 B1* | 10/2015 | Chung ............ H01L 29/42392 |
| 9,431,530 B2* | 8/2016 | Xu ................... H01L 29/7813 |
| 9,437,729 B2* | 9/2016 | Li ................... H01L 29/41741 |
| 9,484,451 B2* | 11/2016 | Chen .................. H01L 29/0634 |
| 2004/0191994 A1* | 9/2004 | Williams et al. ............ 438/270 |
| 2006/0065923 A1* | 3/2006 | Pfirsch ....................... 257/328 |
| 2011/0254084 A1* | 10/2011 | Terrill .................. H01L 29/407 257/330 |

FOREIGN PATENT DOCUMENTS

| | | |
|---|---|---|
| EP | 0075874 | 4/1983 |
| EP | 0133642 | 3/1985 |
| EP | 0438700 | 7/1991 |
| EP | 0583022 | 2/1994 |
| EP | 0583028 | 2/1994 |
| GB | 2028582 | 3/1980 |
| GB | 2253091 | 8/1992 |
| GB | 2269050 | 1/1994 |
| JP | 60-107866 | 6/1985 |
| JP | 62-101076 | 5/1987 |
| JP | 62-298152 | 12/1987 |
| JP | 63-84069 | 4/1988 |
| JP | 63-133678 | 6/1988 |
| JP | 1-209766 | 8/1989 |
| JP | 2-5485 | 1/1990 |
| JP | 2-30187 | 1/1990 |
| JP | 3-203377 | 9/1991 |

OTHER PUBLICATIONS

Baliga et al. "The Insulated Gate Transistor: A New Three-Terminal MOS-Controlled Biplar Power Device", IEEE Transactions on Electron Devices, vol. Ed-31, No. 6, Jun. 1984, pp. 821-828.

Gartner et al. "Electronic Conduction Mechanisms of Cs- and B-Implanted $SiO_2$-Films", Applied Physics 12, 1977, pp. 137-148.

Sandoe et al., "Characterization and Modelling of SIPOS on Silicon High-Voltage Devices", IEE Proceedings, vol. 132, Pt. 1, No. 6, Dec. 1985, pp. 281-284.

Goetzberger, "Invited: Ion Implantation in MOS-Structures", 2419 Solid State Devices 5th Conference, 1973, pp. 289-294.

U.S. Appl. No. 06/787,865, "Method for Fabricating a Buried Schottky Logic Array and Apparatus Produced Thereby", by Francis J. Morris et al., filed Oct. 16, 1985.

U.S. Appl. No. 06/105,695, by H. Uhlig, "Improved Apparatus for Automatically Inserting an Electrical Contact in an Electrical Connector and Method of Making an Electrical Connector Assembly".

Masakatsu Hoshi et al., "A DMOSFET Having A Cell Array Field Ring for Improving Avalanche Capability", May 18, 1993, IEEE, Proceedings of the 5th International Symposium on Power Semiconductor Devices and ICs (ISPSD), Monterey, California, May 18-20, 1993, pp. 141-145, XP000380145.

T. Kikkawa et al., "A New Complementary Transistor Structure For Analog Integrated Circuits", IEEE 1980, CH1616-2/80/0000-065, pp. 65-68.

O. Schade, Jr., et al., "CMOS IIE: A Deep Drain-Extension Implant Technology for Analog/Digital ICs", RCA Review, vol. 47, Sep. 1986, pp. 398-428.

M. Nanba et al., "An Analytical and Experimental Investigation of the Cutoff Frequency fT of High-Speed Bipolar Transistors", IEEE Transactions on Electron Devices, vol. 35, No. 7, Jul. 1988, pp. 1021-1028.

K. Nakazato et al., "A 3GHz Lateral PNP Transistor", IEDM Conference Proceedings, 1986, pp. 416-419, IEEE.

T. Ikeda et al., "Advanced BiCMOS Technology for High Speed VLSI", IEDM Conference Proceedings, 1986, pp. 408-411, IEEE.

T. Matsushita et al., "Intelligent Power Device Having Large Immunity From Transients In Automotive Applications", Proceedings of 1990 International Symposium on Power Semiconductor Devices & ICs, Tokyo, pp. 79-80.

J. Sanchez et al., "Drain-Engineered Hot-Electron-Resistant Device Structures: A Review", IEEE Transactions on Electron Devices, vol. 36, No. 6, Jun. 1989, pp. 1125-1132.

H. Iwai et al., "0.8μm Bi-CMOS Technology With High fT Ion-Implanted Emitter Bipolar Transistor", IEDM Conference Proceedings, 1987, pp. 28-31, IEEE.

(56) References Cited

OTHER PUBLICATIONS

I. Evans et al., "Optimization of Polysilicon Emitters for BiCMOS Transistor Design", IEEE Transactions on Electron Devices, vol. 37, No. 11, Nov. 1990, pp. 2343-2348.

Tatsuhiko Fujihira et al., "Simulated Superior Performances of Semiconductor Superjuction Devices", Proceedings of 1998 International Symposium on Power Semiconductor Devices & ICs, Kyoto, pp. 423-426.

Praveen M. Shenoy et al., "Analysis of the Effect of Charge Imbalance on the Static and Dynamic Characteristics of the Super Junction MOSFET", pp. 99-102, 1999 IEEE.

\* cited by examiner

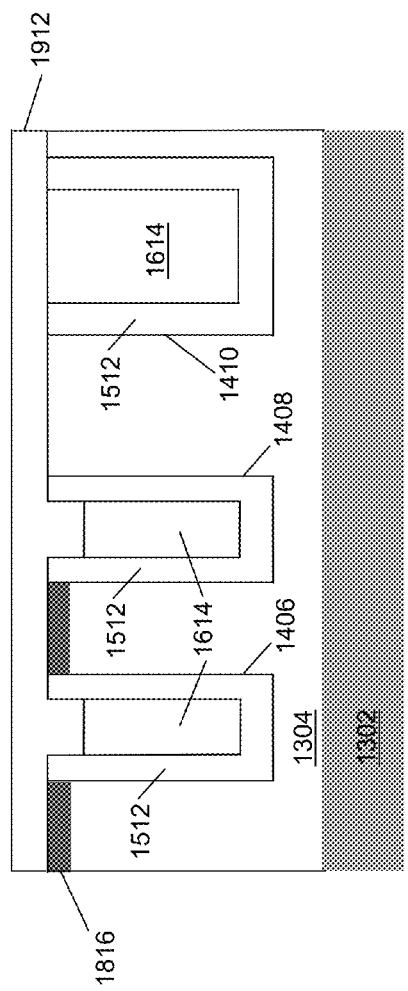
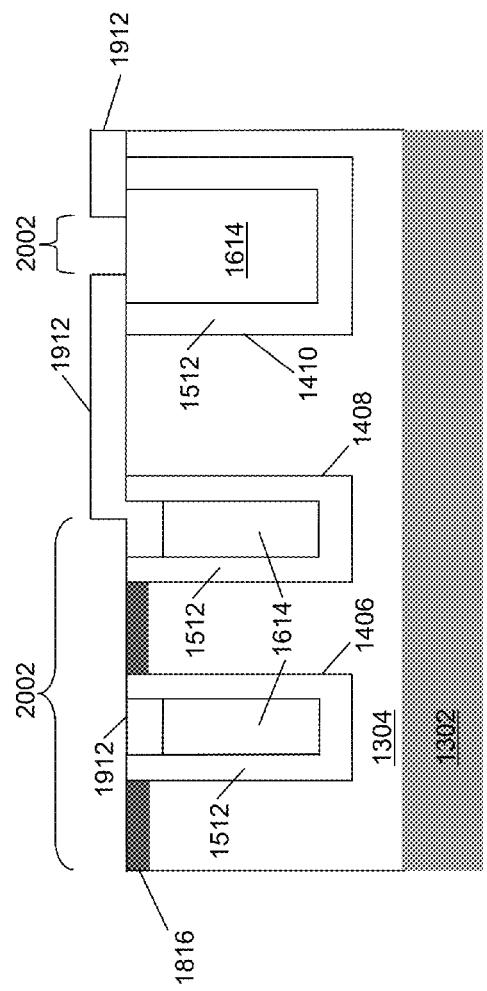

US 9,722,041 B2

BREAKDOWN VOLTAGE BLOCKING DEVICE

BACKGROUND

Currently there is a desire for metal-oxide semiconductor field-effect transistor (MOSFET) devices that are capable of handling high voltage, e.g., 600 volts (V). For example, there are certain applications where it is desirable to plug-in or connect a high voltage MOSFET device to an electrical wall socket. In addition, within the expanding market of solar power technology there is a desire for high voltage MOSFET devices. One type of high voltage MOSFET device that can be utilized for the above described functions is commonly referred to as a Super Junction MOSFET device. However, there is at least one disadvantage associated with the Super Junction MOSFET device. For instance, the typical Super Junction MOSFET device can be very difficult to manufacture since it includes multiple P type vertical junction column regions located within its core drift region.

SUMMARY

Various embodiments in accordance with the invention can enable any power MOSFET to handle high voltage.

In one embodiment, a breakdown voltage blocking device can include an epitaxial region located above a substrate and a plurality of source trenches formed in the epitaxial region. Each source trench can include a dielectric layer surrounding a conductive region. The breakdown voltage blocking device can also include a contact region located in an upper surface of the epitaxial region along with a gate trench formed in the epitaxial region. The gate trench can include a dielectric layer that lines the sidewalls and bottom of the gate trench and a conductive region located between the dielectric layer. The breakdown voltage blocking device can include source metal located above the plurality of source trenches and the contact region. The breakdown voltage blocking device can include gate metal located above the gate trench.

In an embodiment, a circuit can include a metal oxide semiconductor field effect transistor (MOSFET) device and a breakdown voltage blocking device coupled to the MOSFET device. The breakdown voltage blocking device can include an epitaxial region located above a substrate and a plurality of source trenches formed in the epitaxial region. Each source trench can include a dielectric layer surrounding a conductive region. The breakdown voltage blocking device can include a contact region located in an upper surface of the epitaxial region and a gate trench formed in the epitaxial region. The gate trench can include a dielectric layer that lines the sidewalls and bottom of the gate trench and a conductive region located between the dielectric layer. The breakdown voltage blocking device can include source metal located above the plurality of source trenches and the contact region. The breakdown voltage blocking device can include gate metal located above the gate trench.

In one embodiment, a breakdown voltage blocking device can include an epitaxial region located above a substrate and a plurality of source trenches formed in the epitaxial region. Each source trench can include a dielectric layer surrounding a conductive region. The breakdown voltage blocking device can include a contact region located in an upper surface of the epitaxial region and a gate trench formed in the epitaxial region. The gate trench can include a dielectric layer that lines the sidewalls and bottom of the gate trench and a conductive region located between the dielectric layer. The breakdown voltage blocking device can include source metal located above the plurality of source trenches and the contact region. The breakdown voltage blocking device can include gate metal located above the gate trench. The breakdown voltage blocking device blocks more voltage the greater the depth of the plurality of source trenches and the gate trench.

While particular embodiments in accordance with the invention have been specifically described within this Summary, it is noted that the invention and the claimed subject matter are not limited in any way by these embodiments.

BRIEF DESCRIPTION OF THE DRAWINGS

Within the accompanying drawings, various embodiments in accordance with the invention are illustrated by way of example and not by way of limitation. It is noted that like reference numerals denote similar elements throughout the drawings.

FIGS. 13, 14, 15, 16, 17, 18, 19, 20, and 21 are side sectional views of selected fabrication stages of a breakdown voltage blocking device in accordance with various embodiments of the invention.

Figure 1:
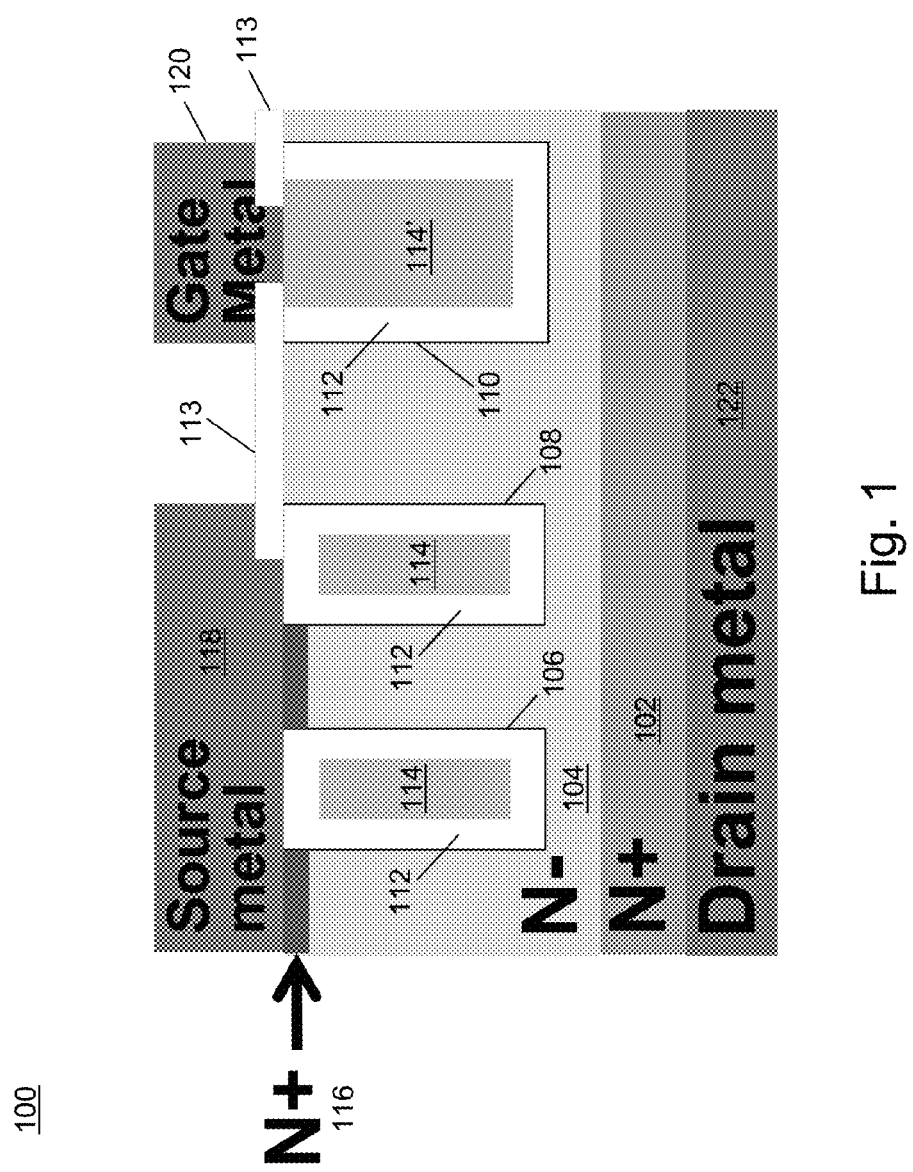
FIG. 1 is a side sectional view of a breakdown voltage blocking device in accordance with various embodiments of the invention.

The drawings referred to in this description should not be understood as being drawn to scale except if specifically noted.

DETAILED DESCRIPTION

Reference will now be made in detail to various embodiments in accordance with the invention, examples of which are illustrated in the accompanying drawings. While the invention will be described in conjunction with various embodiments, it will be understood that these various embodiments are not intended to limit the invention. On the contrary, the invention is intended to cover alternatives, modifications and equivalents, which may be included within the scope of the invention as construed according to the Claims. Furthermore, in the following detailed description of various embodiments in accordance with the invention, numerous specific details are set forth in order to provide a thorough understanding of the invention. However, it will be evident to one of ordinary skill in the art that the invention may be practiced without these specific details or with equivalents thereof. In other instances, well known methods, procedures, components, and circuits have not been described in detail as not to unnecessarily obscure aspects of the invention.

Some portions of the detailed descriptions that follow are presented in terms of procedures, logic blocks, processing, and other symbolic representations of operations for fabricating semiconductor devices. These descriptions and representations are the means used by those skilled in the art of semiconductor device fabrication to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. It should be borne in mind, however, that all of these and similar terms are to be associated with the appropriate physical quantities and are merely convenient labels applied to these quantities. Unless specifically stated otherwise as apparent from the following discussions, it is appreciated that throughout the present application, discussions utilizing terms such as "generating," "creating," "forming," "performing," "producing," "depositing," "etching," "implanting," "removing," or the like, refer to actions and processes of semiconductor device fabrication.

The figures are not drawn to scale, and only portions of the structures, as well as the various layers that form those structures, may be shown in the figures. Furthermore, fabrication processes and steps may be performed along with the processes and steps discussed herein; that is, there may be a number of process steps before, in between and/or after the steps shown and described herein. Importantly, embodiments in accordance with the invention can be implemented in conjunction with these other (perhaps conventional) processes and steps without significantly perturbing them. Generally speaking, embodiments in accordance with the invention can replace portions of a conventional process without significantly affecting peripheral processes and steps.

As used herein, the letter "N" refers to an N-type dopant and the letter "P" refers to a P-type dopant. A plus sign "+" or a minus sign "−" is used to represent, respectively, a relatively high or relatively low concentration of the dopant.

The term "channel" is used herein in the accepted manner. That is, current moves within a FET in a channel, from the source connection to the drain connection. A channel can be made of either n-type or p-type semiconductor material; accordingly, a FET is specified as either an n-channel or p-channel device.

FIG. 1 is a side sectional view of an N-channel breakdown voltage blocking device 100 in accordance with various embodiments of the invention. It is noted that the N-channel breakdown voltage blocking device 100 can be used to block voltage for any other circuitry or circuit device (e.g., transistor, power MOSFET device, and the like). Specifically in one embodiment, the gate of the N-channel breakdown voltage blocking device 100 can control or limit the amount of voltage that exists between its drain and source. As such, in various embodiments, the N-channel breakdown voltage blocking device 100 can be utilized in combination with any other circuitry or circuit device to block and control how much voltage is received by that other circuitry or circuit device. In this manner, the N-channel breakdown voltage blocking device 100 can enable any other circuitry or circuit device to achieve a desired breakdown rating. It is pointed out that the N-channel breakdown voltage blocking device 100 can isolate and protect any other circuitry or circuit device from a high voltage level.

In various embodiments, the breakdown voltage rating of the N-channel blocking device 100 can be tuned or established by one or more of its different structural components. For example, the breakdown voltage rating of the N-channel blocking device 100 can be tuned or established with, but is not limited to, the depth of its trenches (e.g., 106, 108, and 110), the thickness of the dielectric layer (e.g., 112) within those trenches, the doping of the N− doped epitaxial layer (e.g., 104), and/or the thickness of the N− doped epitaxial layer (e.g., 104) located between the bottom of the trenches and its N+ doped substrate (e.g., 102).

Within FIG. 1, in an embodiment, if it is desirable for the N-channel blocking device 100 to block a voltage of 100 V, the N-channel blocking device 100 can be fabricated or implemented with the trenches 106, 108, and 110 each having a depth of approximately 5 microns or micrometers (μm), the dielectric layer 112 within each of the trenches 106, 108, and 110 having a thickness of approximately 4 kiloangstroms (kÅ), and a silicon N+ doped substrate 102. In one embodiment, if it is desirable for the N-channel blocking device 100 to block a voltage of 600 V, the N-channel blocking device 100 can be fabricated or implemented with the trenches 106, 108, and 110 each having a depth of approximately 30 μm, the dielectric layer 112 within each of the trenches 106, 108, and 110 having a thickness of approximately 24 kÅ, and the silicon N+ doped substrate 102. It is pointed out that in an embodiment, if the thickness of the N− doped epitaxial layer 104 is increased between the bottom of the trenches 106, 108, and 110 and the N+ doped substrate 102 for a given breakdown voltage, the thickness of the dielectric layer 112 can be reduced within the trenches 106, 108, and 110.

In an embodiment, if the doping of the N− doped epitaxial layer 104 between the source trenches 106 and 108 for a given dielectric 112 thickness and source trench depth is optimized, the highest blocking voltage can be achieved by the N-channel breakdown voltage blocking device 100. Moreover, the greater the depth of the source trenches 106 and 108, the higher blocking voltage can be achieved by the N-channel breakdown voltage blocking device 100 if its voltage drop on the dielectric 112 is within its rupture limit. However, if the doping of the N− doped epitaxial layer 104 is more or less doped than this optimized doping, the less breakdown voltage the N-channel blocking device 100 can support. Furthermore, the N-channel breakdown voltage blocking device 100 can block higher voltage the greater the thickness of the N− doped epitaxial layer 104 located between the N+ doped substrate 102 and the bottom of the trenches 106, 108, and 110.

In an embodiment, the trenches 106, 108, and 110 of the N-channel breakdown voltage blocking device 100 can each be referred to as a very deep trench. In addition, the gate trench 110 can include the gate of the N-channel breakdown voltage blocking device 100. In one embodiment, the gate of the N-channel breakdown voltage blocking device 100 can be referred to as a control gate, which can help to block high voltage. It is pointed out that the N-channel breakdown voltage blocking device 100 of the present embodiment is a three terminal device (e.g., source metal 118, gate metal 120, and drain metal 122). Note that the dielectric layer 112 within each of the trenches 106, 108, and 110 can be thermally grown, or deposited via chemical vapor deposition (CVD), or formed by any combination thereof, but is not limited to such.

Within FIG. 1, in an embodiment, it is noted that the N-channel breakdown voltage blocking device 100 can be very versatile and can be implemented in a huge number of applications.

In one embodiment, the N-channel breakdown voltage blocking device 100 can include, but is not limited to, the N+doped substrate 102, the N−doped epitaxial region or layer 104, the source trenches 106 and 108, the N+doped regions or layer 116, the source metal 118, the gate trench 110, the gate metal 120, and the drain metal 122. Specifically in an embodiment, the gate trench 110 and the source trenches 106 and 108 can be formed within the N−doped epitaxial layer 104. Moreover, the source trenches 106 and 108 can each include the dielectric layer 112 (e.g., oxide) that surrounds the conductive region or layer 114 (e.g., polysilicon). The source metal 118 can be formed above or over the N+doped regions or layer 116 and the conductive region or layer 114 located within the source trenches 106 and 108 and forms ohmic contact with the N+doped region regions or layer 116. Furthermore, the source metal 118 can be formed over a portion of a dielectric region or layer 113 (e.g. oxide).

Within the N-channel breakdown voltage blocking device 100 of FIG. 1, the gate trench 110 can include the dielectric layer 112 (e.g., oxide) and the conductive region 114' (e.g., polysilicon). Note that within the present embodiment, the dielectric layer 112 within the gate trench 110 isolates the conductive region 114' from the N− doped epitaxial layer 104. Additionally, in an embodiment, the conductive region 114' can be fabricated or implemented such that its width is wider than the width of the conductive region 114 within each of the source trenches 106 and 108. In one embodiment, the conductive region 114' can be fabricated or implemented such that its width is approximately two times wider than the width of the conductive region 114 within each of the source trenches 106 and 108. In one embodiment, the N+ doped regions or layer 116 can be formed within a portion of the upper surface of the N− doped epitaxial layer 104. In addition, the N+ doped regions or layer 116 can form ohmic contact with the source metal 118. In an embodiment, dielectric regions or layer 113 (e.g., oxide) can be formed above the N− doped epitaxial layer 104, the source trench 108, and the gate trench 110. The gate metal 120 can be formed above or over the conductive region 114' located within the gate trench 110 and forms ohmic contact with the conductive region 114'. Moreover, the gate metal 120 can be formed over and between portions of the dielectric regions 113. The drain metal 122 can be located below the N+ doped substrate 102 and forms ohmic contact with the N+ doped substrate 102.

It is noted that the N-channel breakdown voltage blocking device 100 may not include all of the elements illustrated by FIG. 1. In addition, the N-channel breakdown voltage blocking device 100 can be implemented to include one or more elements not illustrated by FIG. 1. It is pointed out that the N-channel breakdown voltage blocking device 100 can be utilized or implemented in any manner similar to that described herein, but is not limited to such.

Figure 2:
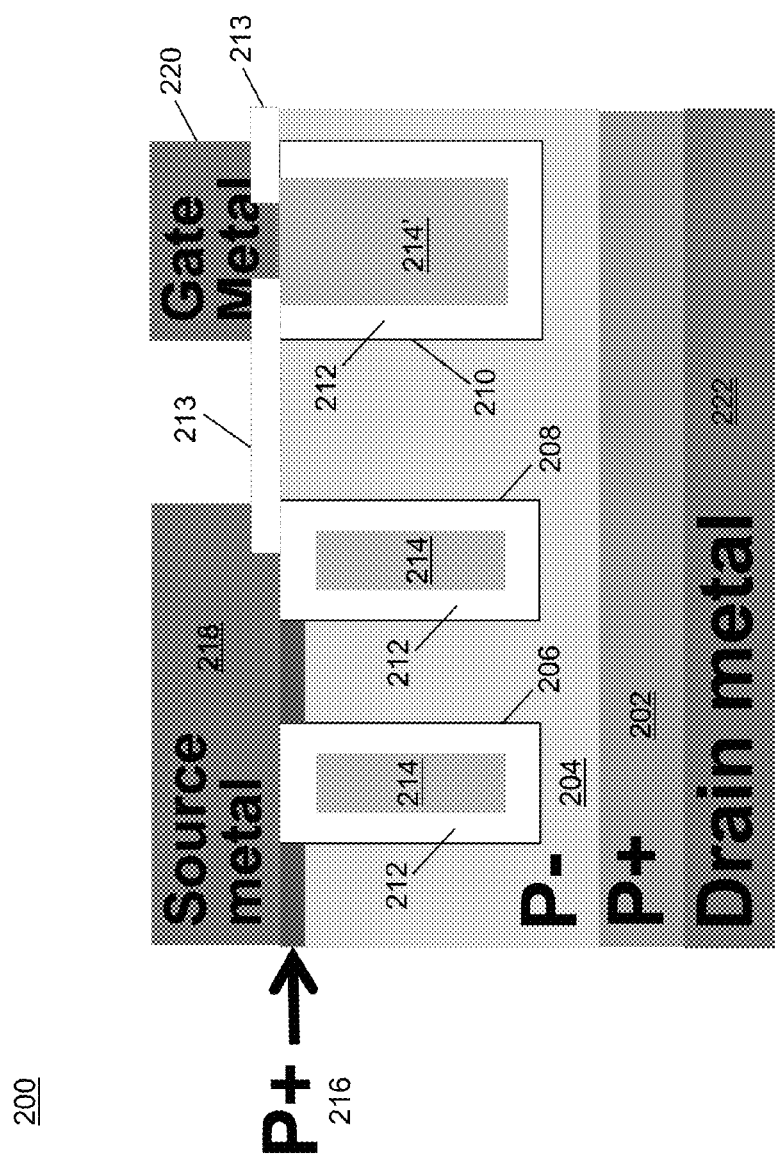
FIG. 2 is a side sectional view of another breakdown voltage blocking device in accordance with various embodiments of the invention.

FIG. 2 is a side sectional view of a P-channel breakdown voltage blocking device 200 in accordance with various embodiments of the invention. The P-channel breakdown voltage blocking device 200 can be used to block voltage for any other circuitry or circuit device (e.g., transistor, power MOSFET device, and the like). In an embodiment, the gate of the P-channel breakdown voltage blocking device 200 can control or limit the amount of voltage that exists between its drain and source. Accordingly, in various embodiments, the P-channel breakdown voltage blocking device 200 can be utilized in combination with any other circuitry or circuit device to block and control how much voltage is received by that other circuitry or circuit device. In this fashion, the P-channel breakdown voltage blocking device 200 can enable any other circuitry or circuit device to achieve a desired breakdown rating. Note that the P-channel breakdown voltage blocking device 200 can isolate and protect any other circuitry or circuit device from a high voltage level.

In various embodiments, the breakdown voltage rating of the P-channel blocking device 200 can be tuned or established by one or more of its different structural components. For example, the breakdown voltage rating of the P-channel blocking device 200 can be tuned or established with, but is not limited to, the depth of its trenches (e.g., 206, 208, and 210), the thickness of the dielectric layer (e.g., 212) within those trenches, the doping of the P− doped epitaxial layer (e.g., 204), and/or the thickness of the P− doped epitaxial layer (e.g., 204) located between the bottom of the trenches and its P+ doped substrate (e.g., 202).

Within FIG. 2, in one embodiment, if it is desirable for the P-channel blocking device 200 to block a voltage of 100 V, the P-channel blocking device 200 can be fabricated or implemented with the trenches 206, 208, and 210 each having a depth of approximately 5 μm, the dielectric layer 212 within each of the trenches 206, 208, and 210 having a thickness of approximately 4 kÅ, and a silicon P+ doped substrate 202. In an embodiment, if it is desirable for the P-channel blocking device 200 to block a voltage of 600 V, the P-channel blocking device 200 can be fabricated or implemented with the trenches 206, 208, and 210 each having a depth of approximately 30 μm, the dielectric layer 212 within each of the trenches 206, 208, and 210 having a thickness of approximately 24 kÅ, a silicon P+ doped substrate 202. Note that in an embodiment, if the thickness of the P− doped epitaxial layer 204 is increased between the bottom of the trenches 206, 208, and 210 and the P+ doped substrate 202 for a given breakdown voltage, the thickness of the dielectric layer 212 can be reduced within the trenches 206, 208, and 210.

In an embodiment, if the doping of the P− doped epitaxial layer 204 between the source trenches 206 and 208 for a given dielectric 212 thickness and source trench depth is optimized, the highest blocking voltage can be achieved by the P-channel breakdown voltage blocking device 200. Moreover, the greater the depth of the source trenches 206 and 208, the higher blocking voltage can be achieved by the P-channel breakdown voltage blocking device 200 if its voltage drop on the dielectric 212 is within its rupture limit. However, if the doping of the P− doped epitaxial layer 204 is more or less doped than this optimized doping, the less breakdown voltage the P-channel blocking device 200 can support. Furthermore, the P-channel breakdown voltage blocking device 200 can block higher voltage the greater the thickness of the P– doped epitaxial layer 204 located between the P+ doped substrate 202 and the bottom of the trenches 206, 208, and 210.

In one embodiment, the trenches 206, 208, and 210 of the P-channel breakdown voltage blocking device 200 can each be referred to as a very deep trench. Additionally, the gate trench 210 can include the gate of the P-channel breakdown voltage blocking device 200. In an embodiment, the gate of the P-channel breakdown voltage blocking device 200 can be referred to as a control gate, which can assist to block high voltage. Note that the P-channel breakdown voltage blocking device 200 of the present embodiment is a three terminal device (e.g., source metal 218, gate metal 220, and drain metal 222). It is noted that the dielectric layer 212 within each of the trenches 206, 208, and 210 can be thermally grown, or deposited via chemical vapor deposition, or formed by any combination thereof, but is not limited to such.

Within FIG. 2, in an embodiment, note that the P-channel breakdown voltage blocking device 200 can be very versatile and can be implemented in a huge number of applications.

In an embodiment, the P-channel breakdown voltage blocking device 200 can include, but is not limited to, the P+ doped substrate 202, the P– doped epitaxial region or layer 204, the source trenches 206 and 208, the P+ doped regions or layer 216, the source metal 218, the gate trench 210, the gate metal 220, and the drain metal 222. Specifically in one embodiment, the gate trench 210 and the source trenches 206 and 208 can be formed within the P– doped epitaxial layer 204. Furthermore, the source trenches 206 and 208 can each include the dielectric layer 212 (e.g., oxide) that surrounds the conductive region 214 (e.g., polysilicon). The source metal 218 can be formed above or over the P+ doped regions or layer 216 and the dielectric layer 212 located within the source trenches 206 and 208 and forms ohmic contact with the P+ doped regions or layer 216. Furthermore, the source metal 218 can be formed over a portion of a dielectric region or layer 213 (e.g. oxide).

Within the P-channel breakdown voltage blocking device 200 of FIG. 2, the gate trench 210 can include the dielectric layer 212 (e.g., oxide) and the conductive region 214' (e.g., polysilicon). Note that within the present embodiment, the dielectric layer 212 within the gate trench 210 isolates the conductive region 214' from the P-doped epitaxial layer 204. Additionally, in an embodiment, the conductive region 214' can be fabricated or implemented such that its width is wider than the width of the conductive region 214 within each of the source trenches 206 and 208. In one embodiment, the conductive region 214' can be fabricated or implemented such that its width is approximately two times wider than the width of the conductive region 214 within each of the source trenches 206 and 208. In an embodiment, the P+ doped regions or layer 216 can be formed within a portion of the upper surface of the P– doped epitaxial layer 204. Additionally, the P+ doped regions or layer 216 can form ohmic contact with the source metal 218. In an embodiment, dielectric regions or layer 213 (e.g., oxide) can be formed above the P– doped epitaxial layer 204, the source trench 208, and the gate trench 210. The gate metal 220 can be formed above or over the conductive region 214' located within the gate trench 210 and forms ohmic contact with the conductive region 214'. Moreover, the gate metal 220 can be formed over and between portions of the dielectric regions 213. The drain metal 222 can be located below the P+ doped substrate 202 and forms ohmic contact with the P+ doped substrate 202.

Note that the P-channel breakdown voltage blocking device 200 may not include all of the elements illustrated by FIG. 2. Additionally, the P-channel breakdown voltage blocking device 200 can be implemented to include one or more elements not illustrated by FIG. 2. It is pointed out that the P-channel breakdown voltage blocking device 200 can be utilized or implemented in any manner similar to that described herein, but is not limited to such.

Figure 3:
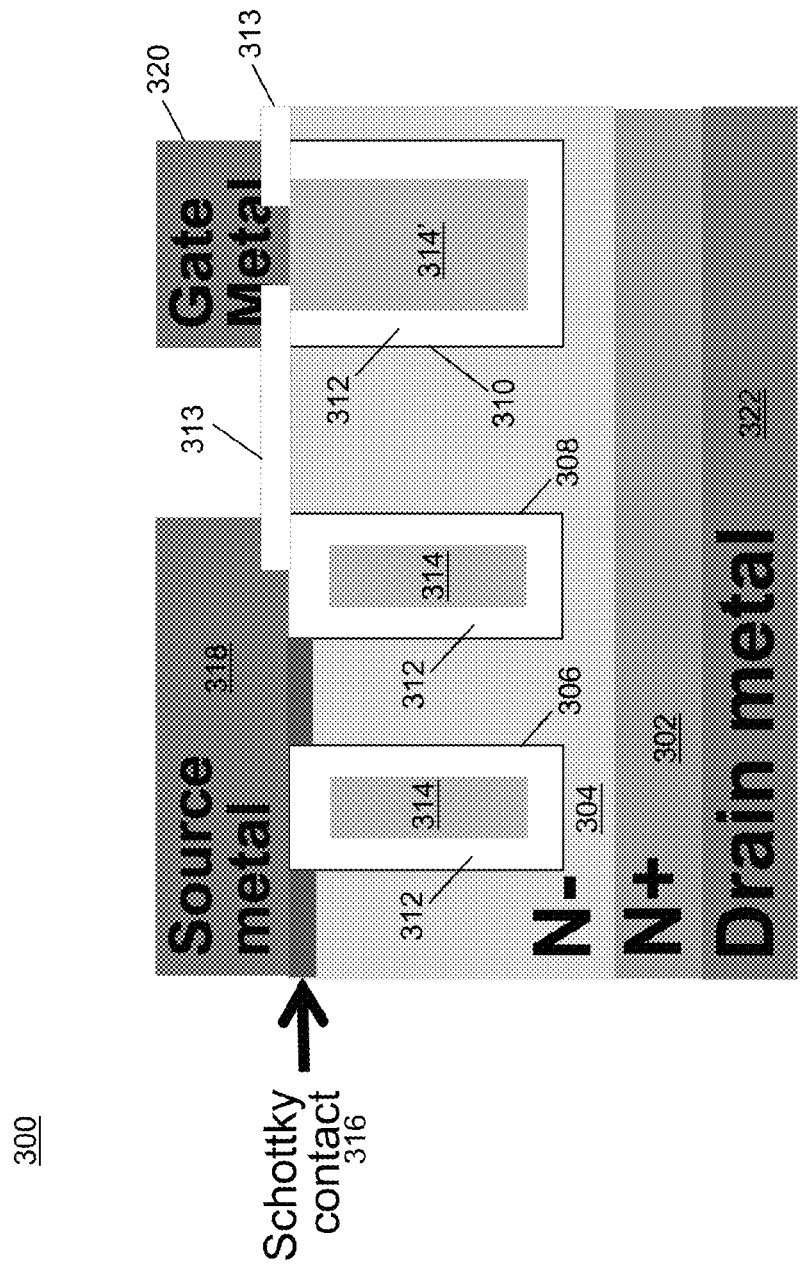
FIG. 3 is a side sectional view of a breakdown voltage blocking device with a Schottky diode in accordance with various embodiments of the invention.

FIG. 3 is a side sectional view of an N-channel breakdown voltage blocking device 300 with Schottky diode in accordance with various embodiments of the invention. The N-channel breakdown voltage blocking device 300 can be used to block voltage for any other circuitry or circuit device (e.g., transistor, power MOSFET device, and the like). In addition to blocking voltage, in an embodiment, the N-channel breakdown voltage blocking device 300 also includes a Schottky diode function since it includes Schottky contacts 316 in contact with an N– doped epitaxial layer 304. It is noted that in one embodiment, the gate of the N-channel breakdown voltage blocking device 300 can control or limit the amount of voltage that exists between its drain and source. Therefore, in various embodiments, the N-channel breakdown voltage blocking device 300 can be utilized in combination with any other circuitry or circuit device to block and control how much voltage is received by that other circuitry or circuit device. In this manner, the N-channel breakdown voltage blocking device 300 can enable any other circuitry or circuit device to achieve a desired breakdown rating. It is pointed out that the N-channel breakdown voltage blocking device 300 can isolate and protect any other circuitry or circuit device from a high voltage level.

In various embodiments, the breakdown voltage rating of the N-channel blocking device 300 can be tuned or established by one or more of its different structural components. For example, the breakdown voltage rating of the N-channel blocking device 300 can be tuned or established with, but is not limited to, the depth of its trenches (e.g., 306, 308, and 310), the thickness of the dielectric layer (e.g., 312) within those trenches, the doping of the N– doped epitaxial layer (e.g., 304), and/or the thickness of the N– doped epitaxial layer (e.g., 304) located between the bottom of the trenches and its N+ doped substrate (e.g., 302).

Within FIG. 3, in an embodiment, if it is desirable for the N-channel blocking device 300 to block a voltage of 100 V, the N-channel blocking device 300 can be fabricated or implemented with the trenches 306, 308, and 310 each having a depth of approximately 5 μm, the dielectric layer 312 within each of the trenches 306, 308, and 310 having a thickness of approximately 4 kÅ, and a silicon N+ doped substrate 302. In one embodiment, if it is desirable for the N-channel blocking device 300 to block a voltage of 600 V, the N-channel blocking device 300 can be fabricated or implemented with the trenches 306, 308, and 310 each having a depth of approximately 30 μm, the dielectric layer 312 within each of the trenches 306, 308, and 310 having a thickness of approximately 24 kÅ, and the silicon N+ doped substrate 302. Note that in an embodiment, if the thickness of the N– doped epitaxial layer 304 is increased between the bottom of the trenches 306, 308, and 310 and the N+ doped substrate 302 for a given breakdown voltage, the thickness of the dielectric layer 312 can be reduced within the trenches 306, 308, and 310.

In an embodiment, if the doping of the N– doped epitaxial layer 304 between the source trenches 306 and 308 for a given dielectric 312 thickness and source trench depth is optimized, the highest blocking voltage can be achieved by the N-channel breakdown voltage blocking device 300. Moreover, the greater the depth of the source trenches 306 and 308, the higher blocking voltage can be achieved by the N-channel breakdown voltage blocking device 300 if its voltage drop on the dielectric 312 is within its rupture limit. However, if the doping of the N− doped epitaxial layer 304 is more or less doped than this optimized doping, the less breakdown voltage the N-channel blocking device 300 can support. Furthermore, the N-channel breakdown voltage blocking device 300 can block more voltage the greater the thickness of the N− doped epitaxial layer 304 located between the N+ doped substrate 302 and the bottom of the trenches 306, 308, and 310.

In an embodiment, the trenches 306, 308, and 310 of the N-channel breakdown voltage blocking device 300 can each be referred to as a very deep trench. Furthermore, the gate trench 310 can include the gate of the N-channel breakdown voltage blocking device 300. In one embodiment, the gate of the N-channel breakdown voltage blocking device 300 can be referred to as a control gate, which can help to block high voltage. It is noted that the N-channel breakdown voltage blocking device 300 of the present embodiment is a three terminal device (e.g., source metal 318, gate metal 320, and drain metal 322). It is pointed out that the dielectric layer 312 within each of the trenches 306, 308, and 310 can be thermally grown, or deposited via chemical vapor deposition, or formed by any combination thereof, but is not limited to such.

Within FIG. 3, in an embodiment, note that the N-channel breakdown voltage blocking device 300 can be very versatile and can be implemented in a huge number of applications. In addition, it is pointed out that the Schottky contacts 316 has a faster recovery when switching (or faster switching speed) than an ohmic contact (e.g., 116 or 216).

In one embodiment, the breakdown voltage blocking device 300 can include, but is not limited to, the N+ doped substrate 302, the N− doped epitaxial region or layer 304, the source trenches 306 and 308, the Schottky contacts 316, the source metal 318, the gate trench 310, the gate metal 320, and the drain metal 322. Specifically in an embodiment, the gate trench 310 and the source trenches 306 and 308 can be formed within the N− doped epitaxial layer 304. Additionally, the source trenches 306 and 308 can each include the dielectric layer 312 (e.g., oxide) that surrounds the conductive region 314 (e.g., polysilicon). The source metal 318 can be formed above or over the Schottky contacts 316 and the dielectric layer 312 located within the source trenches 306 and 308 and forms Schottky contact with the N− doped epitaxial layer 304 in between the source trenches 306 and 308. Furthermore, the source metal 318 can be formed over a portion of a dielectric region or layer 313 (e.g. oxide).

Within the breakdown voltage blocking device 300 of FIG. 3, the gate trench 310 can include the dielectric layer 312 (e.g., oxide) and the conductive region 314' (e.g., polysilicon). Note that within the present embodiment, the dielectric layer 312 within the gate trench 310 isolates the conductive region 314' from the N− doped epitaxial layer 304. In addition, in an embodiment, the conductive region 314' can be fabricated or implemented such that its width is wider than the width of the conductive region 314 within each of the source trenches 306 and 308. In an embodiment, the conductive region 314' can be fabricated or implemented such that its width is approximately two times wider than the width of the conductive region 314 within each of the source trenches 306 and 308. In an embodiment, the Schottky contacts 316 can be formed within a portion of the upper surface of the N− doped epitaxial layer 304 in between and near the source trenches 306 and 308. Moreover, the Schottky contacts 316 can be formed with the source metal 318. Note that the Schottky contacts 316 can be implemented with one or more metals (e.g. platinum, tungsten, chromium, molybdenum, and the like). In an embodiment, dielectric regions or layer 313 (e.g., oxide) can be formed above the N− doped epitaxial layer 304, the source trench 308, and the gate trench 310. The gate metal 320 can be formed above or over the conductive region 314' located within the gate trench 310 and forms ohmic contact with the conductive region 314'. Moreover, the gate metal 320 can be formed over and between portions of the dielectric regions 313. The drain metal 322 can be located below the N+ doped substrate 302 and forms ohmic contact with the N+ doped substrate 302.

It is pointed out the N-channel breakdown voltage blocking device 300 may not include all of the elements illustrated by FIG. 3. Furthermore, the N-channel breakdown voltage blocking device 300 can be implemented to include one or more elements not illustrated by FIG. 3. For example, in various embodiments, a different type of metal (e.g., titanium, tungsten, cobalt, and the like) could be added or implemented between the source metal 318 and the N− doped epitaxial layer 304 to form the Schottky contacts 316. Note that the N-channel breakdown voltage blocking device 300 can be utilized or implemented in any manner similar to that described herein, but is not limited to such.

Figure 4:
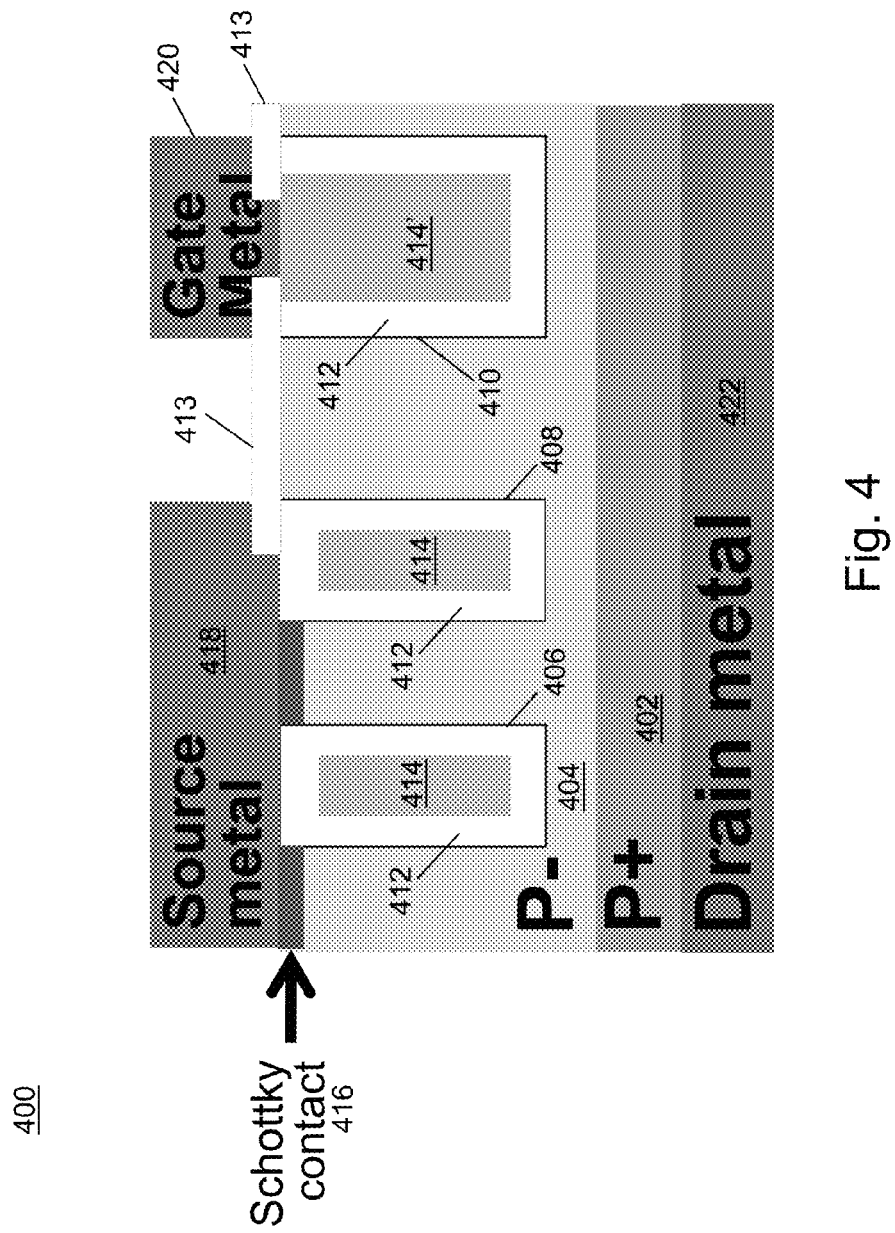
FIG. 4 is a side sectional view of another breakdown voltage blocking device with a Schottky diode in accordance with various embodiments of the invention.

FIG. 4 is a side sectional view of a P-channel breakdown voltage blocking device 400 with Schottky diode in accordance with various embodiments of the invention. The P-channel breakdown voltage blocking device 400 can be used to block voltage for any other circuitry or circuit device (e.g., transistor, power MOSFET device, and the like). As well as blocking voltage, the P-channel breakdown voltage blocking device 400 also includes a Schottky diode function since it includes Schottky contacts 416. Note that in one embodiment, the gate of the P-channel breakdown voltage blocking device 400 can control or limit the amount of voltage that exists between its drain and source. As such, in various embodiments, the P-channel breakdown voltage blocking device 400 can be utilized in combination with any other circuitry or circuit device to block and control how much voltage is received by that other circuitry or circuit device. In this fashion, the P-channel breakdown voltage blocking device 400 can enable any other circuitry or circuit device to achieve a desired breakdown rating. It is noted that the P-channel breakdown voltage blocking device 400 can isolate and protect any other circuitry or circuit device from a high voltage level.

In various embodiments, the breakdown voltage rating of the P-channel blocking device 400 can be tuned or established by one or more of its different structural components. For example, the breakdown voltage rating of the P-channel blocking device 400 can be tuned or established with, but is not limited to, the depth of its trenches (e.g., 406, 408, and 410), the thickness of the dielectric layer (e.g., 412) within those trenches, the doping of the P− doped epitaxial layer (e.g., 404), and/or the thickness of the P− doped epitaxial layer (e.g., 404) located between the bottom of the trenches and its P+ doped substrate (e.g., 402).

Within FIG. 4, in one embodiment, if it is desirable for the P-channel blocking device 400 to block a voltage of 100 V, the P-channel blocking device 400 can be fabricated or implemented with the trenches 406, 408, and 410 each having a depth of approximately 5 µm, the dielectric layer 412 within each of the trenches 406, 408, and 410 having a thickness of approximately 4 kÅ, and a silicon P+ doped substrate 402. In an embodiment, if it is desirable for the P-channel blocking device 400 to block a voltage of 600 V, the P-channel blocking device 400 can be fabricated or implemented with the trenches 406, 408, and 410 each having a depth of approximately 30 μm, the dielectric layer 412 within each of the trenches 406, 408, and 410 having a thickness of approximately 24 kÅ, and a silicon P+ doped substrate 402. It is noted that in an embodiment, if the thickness of the P− doped epitaxial layer 404 is increased between the bottom of the trenches 406, 408, and 410 and the P+ doped substrate 402 for a given breakdown voltage, the thickness of the dielectric layer 412 can be reduced within the trenches 406, 408, and 410.

In an embodiment, if the doping of the P− doped epitaxial layer 404 between the source trenches 406 and 408 for a given dielectric 412 thickness and source trench depth is optimized, the highest blocking voltage can be achieved by the P-channel breakdown voltage blocking device 400. Moreover, the greater the depth of the source trenches 406 and 408, the higher blocking voltage can be achieved by the P-channel breakdown voltage blocking device 400 if it is within the rupture limit of the dielectric 412. However, if the doping of the P− doped epitaxial layer 404 is more or less doped than this optimized doping, the less breakdown voltage the P-channel blocking device 400 can support. Furthermore, the P-channel breakdown voltage blocking device 400 can block more voltage the greater the thickness of the P− doped epitaxial layer 404 located between the P+ doped substrate 402 and the bottom of the trenches 406, 408, and 410.

In one embodiment, the trenches 406, 408, and 410 of the P-channel breakdown voltage blocking device 400 can each be referred to as a very deep trench. Additionally, the gate trench 410 can include the gate of the P-channel breakdown voltage blocking device 400. In an embodiment, the gate of the P-channel breakdown voltage blocking device 400 can be referred to as a control gate, which can help to block high voltage. Note that the P-channel breakdown voltage blocking device 400 of the present embodiment is a three terminal device (e.g., source metal 418, gate metal 420, and drain metal 422). It is noted that the dielectric layer 412 within each of the trenches 406, 408, and 410 can be thermally grown, or deposited via chemical vapor deposition, or formed by any combination thereof, but is not limited to such.

Within FIG. 4, in one embodiment, it is noted that the P-channel breakdown voltage blocking device 400 can be very versatile and can be implemented in a huge number of applications. Furthermore, note that the Schottky contacts 416 has a faster recovery when switching (or faster switching speed) than an ohmic contact (e.g., 116 or 216).

In an embodiment, the breakdown voltage blocking device 400 can include, but is not limited to, the P+ doped substrate 402, the P− doped epitaxial region or layer 404, the source trenches 406 and 408, the Schottky contacts 416, the source metal 418, the gate trench 410, the gate metal 420, and the drain metal 422. Specifically in one embodiment, the gate trench 410 and the source trenches 406 and 408 can be formed within the P− doped epitaxial layer 404. In addition, the source trenches 406 and 408 can each include the dielectric layer 412 (e.g., oxide) that surrounds the conductive region 414 (e.g., polysilicon). The source metal 418 can be formed above or over the Schottky contacts 416 and the dielectric layer 412 located within the source trenches 406 and 408 and forms the Schottky contacts 416 with the P− doped epitaxial layer 404 in between the source trenches 406 and 408. Furthermore, the source metal 418 can be formed over a portion of a dielectric region or layer 413 (e.g. oxide).

Within the breakdown voltage blocking device 400 of FIG. 4, the gate trench 410 can include the dielectric layer 412 (e.g., oxide) and the conductive region 414' (e.g., polysilicon). Note that within the present embodiment, the dielectric layer 412 within the gate trench 410 isolates the conductive region 414' from the P− doped epitaxial layer 404. In addition, in an embodiment, the conductive region 414' can be fabricated or implemented such that its width is wider than the width of the conductive region 414 within each of the source trenches 406 and 408. In one embodiment, the conductive region 414' can be fabricated or implemented such that its width is approximately two times wider than the width of the conductive region 414 within each of the source trenches 406 and 408. In one embodiment, the Schottky contacts 416 can be formed within a portion of the upper surface of the P− doped epitaxial layer 404 in between and near the source trenches 406 and 408. Moreover, the source metal 418 can form the Schottky contacts 416 with the P− doped epitaxial layer 404. In an embodiment, dielectric regions or layer 413 (e.g., oxide) can be formed above the P-doped epitaxial layer 404, the source trench 408, and the gate trench 410. The gate metal 420 can be formed above or over the conductive region 414' located within the gate trench 410 and forms ohmic contact with the conductive region 414'. Moreover, the gate metal 420 can be formed over and between portions of the dielectric regions 413. The drain metal 422 can be located below the P+ doped substrate 402 and forms ohmic contact with the P+ doped substrate 402.

Note that the P-channel breakdown voltage blocking device 400 may not include all of the elements illustrated by FIG. 4. In addition, the P-channel breakdown voltage blocking device 400 can be implemented to include one or more elements not illustrated by FIG. 4. It is pointed out that the P-channel breakdown voltage blocking device 400 can be utilized or implemented in any manner similar to that described herein, but is not limited to such.

Figure 5:
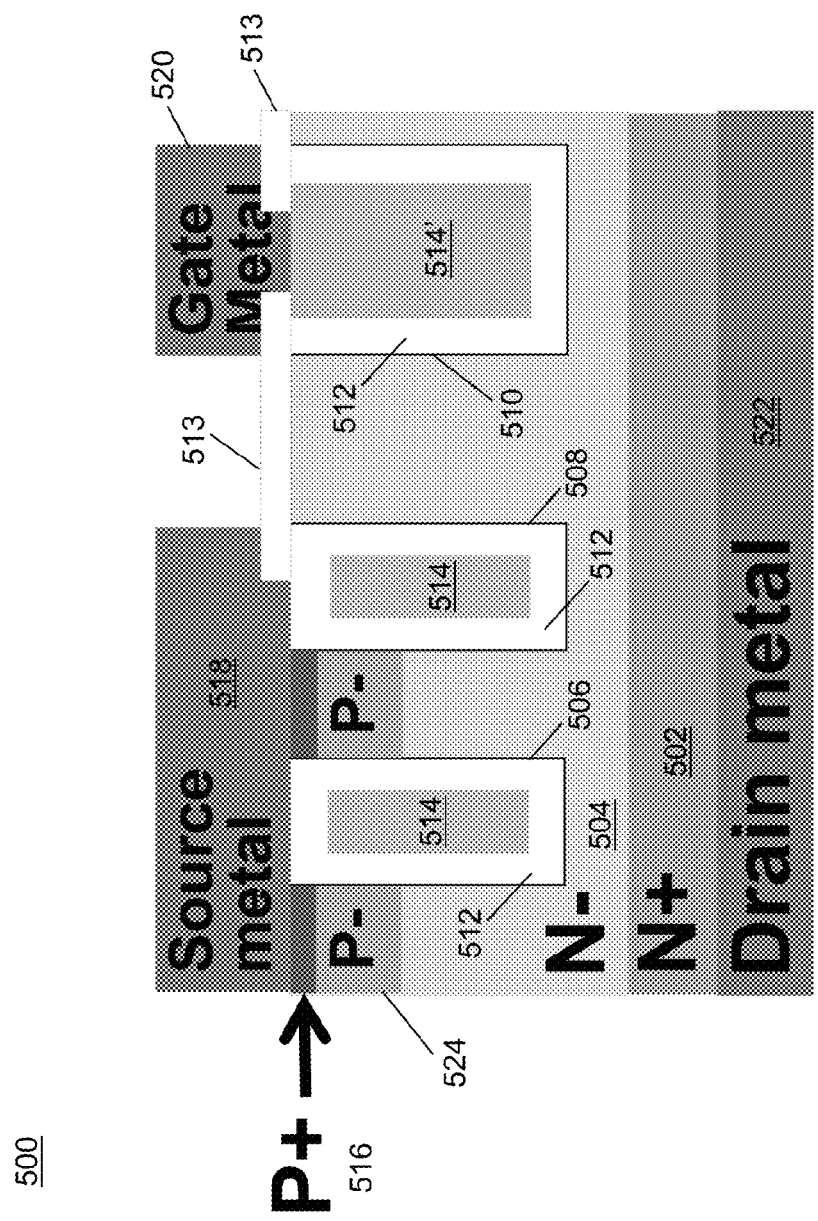
FIG. 5 is a side sectional view of a breakdown voltage blocking device with an integrated diode in accordance with various embodiments of the invention.

FIG. 5 is a side sectional view of an N-channel breakdown voltage blocking device 500 with an integrated diode in accordance with various embodiments of the invention. The N-channel breakdown voltage blocking device 500 can be used to block voltage for any other circuitry or circuit device (e.g., transistor, power MOSFET device, and the like). In addition to blocking voltage, the N-channel breakdown voltage blocking device 500 also includes an integrated diode. Within the present embodiment, the integrated diode is formed by P− doped regions 524 in contact with an N− doped epitaxial layer 504, which create a p-n junction. It is noted that in one embodiment, the gate of the N-channel breakdown voltage blocking device 500 can control or limit the amount of voltage that exists between its drain and source. Therefore, in various embodiments, the N-channel breakdown voltage blocking device 500 can be utilized in combination with any other circuitry or circuit device to block and control how much voltage is received by that other circuitry or circuit device. In this manner, the N-channel breakdown voltage blocking device 500 can enable any other circuitry or circuit device to achieve a desired breakdown rating. Note that the N-channel breakdown voltage blocking device 500 can isolate and protect any other circuitry or circuit device from a high voltage level.

In various embodiments, the breakdown voltage rating of the N-channel blocking device 500 can be tuned or established by one or more of its different structural components.

For example, the breakdown voltage rating of the N-channel blocking device 500 can be tuned or established with, but is not limited to, the depth of its trenches (e.g., 506, 508, and 510), the thickness of the dielectric layer (e.g., 512) within those trenches, the doping and depth of P– doped regions 524, the doping of the N– doped epitaxial layer (e.g., 504), and/or the thickness of the N– doped epitaxial layer (e.g., 504) located between the bottom of the trenches and its N+ doped substrate (e.g., 502).

Within FIG. 5, in one embodiment, if it is desirable for the N-channel blocking device 500 to block a voltage of 100 V, the N-channel blocking device 500 can be fabricated or implemented with the trenches 506, 508, and 510 each having a depth of approximately 5 μm, the dielectric layer 512 within each of the trenches 506, 508, and 510 having a thickness of approximately 4 kÅ, and a silicon N+ doped substrate 502. In an embodiment, if it is desirable for the N-channel blocking device 500 to block a voltage of 600 V, the N-channel blocking device 500 can be fabricated or implemented with the trenches 506, 508, and 510 each having a depth of approximately 30 μm, the dielectric layer 512 within each of the trenches 506, 508, and 510 having a thickness of approximately 24 kÅ, and a silicon N+ doped substrate 502. It is pointed out that in an embodiment, if the thickness of the N– doped epitaxial layer 504 is increased between the bottom of the trenches 506, 508, and 510 and the N+ doped substrate 502 for a given breakdown voltage, the thickness of the dielectric layer 512 can be reduced within the trenches 506, 508, and 510.

In an embodiment, if the doping of the N– doped epitaxial layer 504 between the source trenches 506 and 508 for a given dielectric 512 thickness and source trench depth is optimized, the highest blocking voltage can be achieved by the N-channel breakdown voltage blocking device 500. Moreover, the greater the depth of the source trenches 506 and 508, the higher blocking voltage can be achieved by the N-channel breakdown voltage blocking device 500 if its voltage drop on the dielectric 512 is within its rupture limit. However, if the doping of the N– doped epitaxial layer 504 is more or less doped than this optimized doping, the less breakdown voltage the N-channel blocking device 500 can support. Furthermore, the breakdown voltage N-channel blocking device 500 can block more voltage the greater the thickness of the N– doped epitaxial layer 504 located between the N+ doped substrate 502 and the bottom of the trenches 506, 508, and 510.

In one embodiment, the trenches 506, 508, and 510 of the N-channel breakdown voltage blocking device 500 can each be referred to as a very deep trench. Additionally, the gate trench 510 can include the gate of the N-channel breakdown voltage blocking device 500. In an embodiment, the gate of the N-channel breakdown voltage blocking device 500 can be referred to as a control gate, which can help to block high voltage. It is pointed out that the N-channel breakdown voltage blocking device 500 of the present embodiment is a three terminal device (e.g., source metal 518, gate metal 520, and drain metal 522). Note that the dielectric layer 512 within each of the trenches 506, 508, and 510 can be thermally grown, or deposited via chemical vapor deposition, or formed by any combination thereof, but is not limited to such.

Within FIG. 5, in an embodiment, note that the N-channel breakdown voltage blocking device 500 can be very versatile and can be implemented in a huge number of applications.

In an embodiment, the N-channel breakdown voltage blocking device 500 can include, but is not limited to, the N+ substrate 502, the N– doped epitaxial region or layer 504, the source trenches 506 and 508, the P– doped regions 524, the P+ doped regions or layer 516, the source metal 518, the gate trench 510, the gate metal 520, and the drain metal 522. Specifically in one embodiment, the gate trench 510 and the source trenches 506 and 508 can be formed within the N– doped epitaxial layer 504. Furthermore, the source trenches 506 and 508 can each include the dielectric layer 512 (e.g., oxide) that surrounds the conductive region 514 (e.g., polysilicon). The source metal 518 can be formed above or over the P+ doped regions or layer 516 and forms ohmic contact with the P+ doped regions or layer 516. In addition, the source metal 518 can be formed over a portion of a dielectric region or layer 513 (e.g. oxide).

Within the N-channel breakdown voltage blocking device 500 of FIG. 5, the gate trench 510 can include the dielectric layer 512 (e.g., oxide) and the conductive region 514' (e.g., polysilicon). Note that within the present embodiment, the dielectric layer 512 within the gate trench 510 isolates the conductive region 514' from the N-doped epitaxial layer 504. Furthermore, in an embodiment, the conductive region 514' can be fabricated or implemented such that its width is wider than the width of the conductive region 514 within each of the source trenches 506 and 508. In one embodiment, the conductive region 514' can be fabricated or implemented such that its width is approximately two times wider than the width of the conductive region 514 within each of the source trenches 506 and 508. In an embodiment, the P– doped regions 524 can be formed within a portion of the N– doped epitaxial layer 504 in between and near the source trenches 506 and 508. Furthermore, the P+ doped regions or layer 516 can be formed within a portion of the upper surface of the P– doped regions 524 in between and near the source trenches 506 and 508. In addition, the P+ doped regions or layer 516 can form ohmic contact with the source metal 518. In an embodiment, dielectric regions or layer 513 (e.g., oxide) can be formed above the N-doped epitaxial layer 504, the source trench 508, and the gate trench 510. The gate metal 520 can be formed above or over the dielectric layer 512 and the conductive region 514' located within the gate trench 510 and forms ohmic contact with the conductive region 514'. Moreover, the gate metal 520 can be formed over and between portions of the dielectric regions 513. The drain metal 522 can be located below the N+ doped substrate 502 and forms ohmic contact with the N+ doped substrate 502.

It is noted that the N-channel breakdown voltage blocking device 500 may not include all of the elements illustrated by FIG. 5. Additionally, the N-channel breakdown voltage blocking device 500 can be implemented to include one or more elements not illustrated by FIG. 5. Note that the N-channel breakdown voltage blocking device 500 can be utilized or implemented in any manner similar to that described herein, but is not limited to such.

Figure 6:
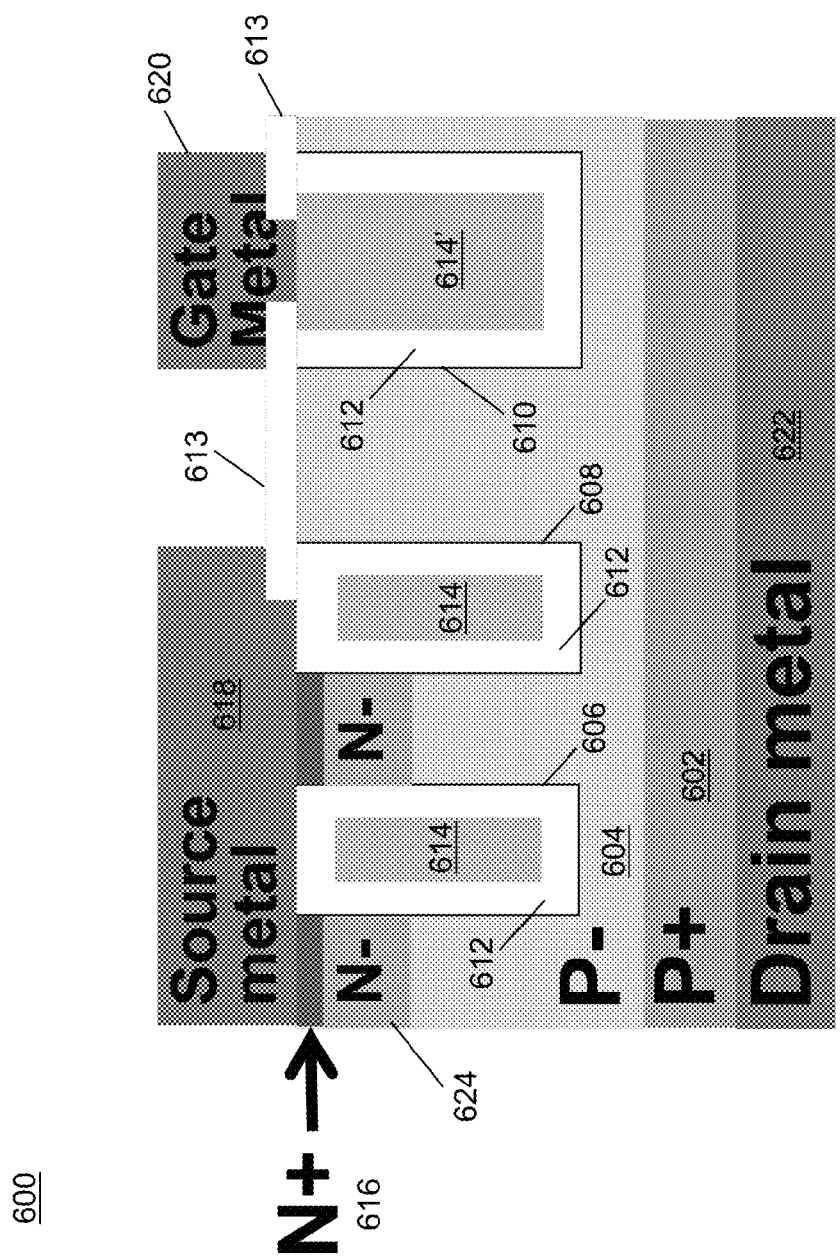
FIG. 6 is a side sectional view of another breakdown voltage blocking device with an integrated diode in accordance with various embodiments of the invention.

FIG. 6 is a side sectional view of a P-channel breakdown voltage blocking device 600 with an integrated diode in accordance with various embodiments of the invention. The P-channel breakdown voltage blocking device 600 can be used to block voltage for any other circuitry or circuit device (e.g., transistor, power MOSFET device, and the like). As well as blocking voltage, the P-channel breakdown voltage blocking device 600 also includes an integrated diode. Within the present embodiment, the integrated diode is formed by N– doped regions 624 in contact with a P– doped epitaxial layer 604, which create a p-n junction. It is pointed out that in one embodiment, the gate of the P-channel breakdown voltage blocking device 600 can control or limit the amount of voltage that exists between its drain and source. As such, in various embodiments, the P-channel breakdown voltage blocking device 600 can be utilized in combination with any other circuitry or circuit device to block and control how much voltage is received by that other circuitry or circuit device. In this manner, the P-channel breakdown voltage blocking device 600 can enable any other circuitry or circuit device to achieve a desired breakdown rating. It is noted that the P-channel breakdown voltage blocking device 600 can isolate and protect any other circuitry or circuit device from a high voltage level.

In various embodiments, the breakdown voltage rating of the P-channel blocking device 600 can be tuned or established by one or more of its different structural components. For example, the breakdown voltage rating of the P-channel blocking device 600 can be tuned or established with, but is not limited to, the depth of its trenches (e.g., 606, 608, and 610), the thickness of the dielectric layer (e.g., 612) within those trenches, the doping and depth of the N-doped region 624, the doping of the P– doped epitaxial layer (e.g., 604), and/or the thickness of the P– doped epitaxial layer (e.g., 604) located between the bottom of the trenches and its P+ doped substrate (e.g., 602).

Within FIG. 6, in an embodiment, if it is desirable for the P-channel blocking device 600 to block a voltage of 100 V, the P-channel blocking device 600 can be fabricated or implemented with the trenches 606, 608, and 610 each having a depth of approximately 5 μm, the dielectric layer 612 within each of the trenches 606, 608, and 610 having a thickness of approximately 4 kÅ, and a silicon P+ doped substrate 602. In one embodiment, if it is desirable for the P-channel blocking device 600 to block a voltage of 600 V, the P-channel blocking device 600 can be fabricated or implemented with the trenches 606, 608, and 610 each having a depth of approximately 30 μm, the dielectric layer 612 within each of the trenches 606, 608, and 610 having a thickness of approximately 24 kÅ, and a silicon P+ doped substrate 602. Note that in an embodiment, if the thickness of the P– doped epitaxial layer 604 is increased between the bottom of the trenches 606, 608, and 610 and the P+ doped substrate 602 for a given breakdown voltage, the thickness of the dielectric layer 612 can be reduced within the trenches 606, 608, and 610.

In an embodiment, if the doping of the P– doped epitaxial layer 604 between the source trenches 606 and 608 for a given dielectric 612 thickness and source trench depth is optimized, the highest blocking voltage can be achieved by the P-channel breakdown voltage blocking device 600. Moreover, the greater the depth of the source trenches 606 and 608, the higher blocking voltage can be achieved by the P-channel breakdown voltage blocking device 600 if its voltage drop on the dielectric 612 is within its rupture limit. However, if the doping of the P– doped epitaxial layer 604 is more or less doped than this optimized doping, the less breakdown voltage the P-channel blocking device 600 can support. Furthermore, the P-channel breakdown voltage blocking device 600 can block more voltage the greater the thickness of the P– doped epitaxial layer 604 located between the P+ doped substrate 602 and the bottom of the trenches 606, 608, and 610.

In an embodiment, the trenches 606, 608, and 610 of the P-channel breakdown voltage blocking device 600 can each be referred to as a very deep trench. Moreover, the gate trench 610 can include the gate of the P-channel breakdown voltage blocking device 600. In one embodiment, the gate of the P-channel breakdown voltage blocking device 600 can be referred to as a control gate, which can help to block high voltage. Note that the P-channel breakdown voltage blocking device 600 of the present embodiment is a three terminal device (e.g., source metal 618, gate metal 620, and drain metal 622). It is pointed out that the dielectric layer 612 within each of the trenches 606, 608, and 610 can be thermally grown, or deposited via chemical vapor deposition, or formed by any combination thereof, but is not limited to such.

Within FIG. 6, in an embodiment, note that the P-channel breakdown voltage blocking device 600 can be very versatile and can be implemented in a huge number of applications.

In one embodiment, the P-channel breakdown voltage blocking device 600 can include, but is not limited to, the P+ substrate 602, the P– doped epitaxial region or layer 604, the source trenches 606 and 608, the N– doped regions 624, the N+ doped regions or layer 616, the source metal 618, the gate trench 610, the gate metal 620, and the drain metal 622. Specifically in an embodiment, the gate trench 610 and the source trenches 606 and 608 can be formed within the P– doped epitaxial layer 604. Additionally, the source trenches 606 and 608 can each include the dielectric layer 612 (e.g., oxide) that surrounds the conductive region 614 (e.g., polysilicon). The source metal 618 can be formed above or over the N+ doped regions or layer 616 and the dielectric layer 612 located within the source trenches 606 and 608 and form ohmic contact with N+ doped regions or layer 616. In addition, the source metal 618 can be formed over a portion of a dielectric region or layer 613 (e.g. oxide).

Within the P-channel breakdown voltage blocking device 600 of FIG. 6, the gate trench 610 can include the dielectric layer 612 (e.g., oxide) and the conductive region 614' (e.g., polysilicon). Note that within the present embodiment, the dielectric layer 612 within the gate trench 610 isolates the conductive region 614' from the P-doped epitaxial layer 604. In addition, in an embodiment, the conductive region 614' can be fabricated or implemented such that its wide is wider than the width of the conductive region 614 within each of the source trenches 606 and 608. In one embodiment, the conductive region 614' can be fabricated or implemented such that its width is approximately two times wider than the width of the conductive region 614 within each of the source trenches 606 and 608. In one embodiment, the N– doped regions 624 can be formed within a portion of the P– doped epitaxial layer 604 in between and near the source trenches 606 and 608. Additionally, the N+ doped regions or layer 616 can be formed within a portion of the upper surface of the N– doped regions 624 in between and near the source trenches 606 and 608. Furthermore, the N+ doped regions or layer 616 can form ohmic contact with the source metal 618. In an embodiment, dielectric regions or layer 613 (e.g., oxide) can be formed above the P– doped epitaxial layer 604, the source trench 608, and the gate trench 610. The gate metal 620 can be deposited and formed above or over the dielectric layer 612 and the conductive region 614' located within the gate trench 610 and form ohmic contact with the conductive region 614'. Moreover, the gate metal 620 can be formed over and between portions of the dielectric regions 613. The drain metal 622 can be located below the P+ doped substrate 602 and form ohmic contact with the P+ doped substrate 602.

It is pointed out that the P-channel breakdown voltage blocking device 600 may not include all of the elements illustrated by FIG. 6. Moreover, the P-channel breakdown voltage blocking device 600 can be implemented to include one or more elements not illustrated by FIG. 6. It is noted that the P-channel breakdown voltage blocking device 600 can be utilized or implemented in any manner similar to that described herein, but is not limited to such.

Figure 7:
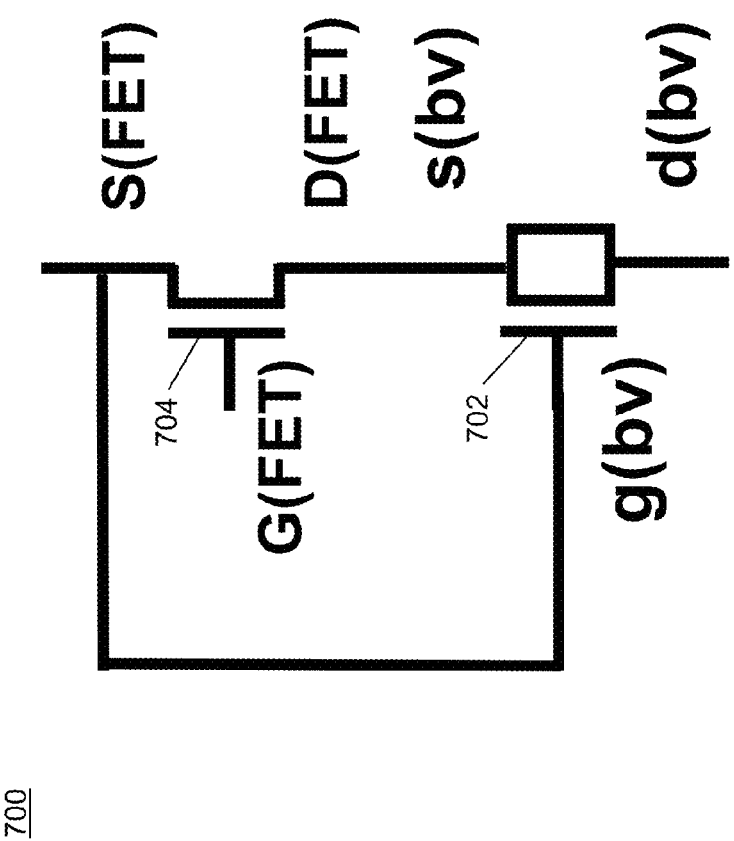
FIG. 7 is a schematic diagram of a circuit in accordance with various embodiments of the invention.

FIG. 7 is a schematic diagram of a circuit 700 that can include a breakdown voltage blocking device 702 coupled with a power MOSFET device 704 in accordance with various embodiments of the invention. Specifically, circuit 700 illustrates the combination of the breakdown voltage blocking device 702 with the power MOSFET device 704 to achieve a desired breakdown voltage rating. In an embodiment, note that the breakdown voltage blocking device 702 can be co-packaged with any power MOSFET devices (e.g., 704) to achieve a desired breakdown voltage rating.

Within the present embodiment, the breakdown voltage blocking device 702 can include a gate terminal (g(bv)), a source terminal (s(bv)), and a drain terminal (d(bv)) while the power MOSFET device 704 can include a gate terminal (G(FET)), a source terminal (S(FET)), and a drain terminal (D(FET)). In addition, the gate of the breakdown voltage blocking device 702 can be coupled to the source of the power MOSFET device 704 in order to set the voltage potential inside the breakdown voltage blocking device 702 that blocks the flow of current from its drain to its source. In this manner, the gate of the breakdown voltage blocking device 702 is a control gate that enables blocking of a high voltage level from reaching the power MOSFET device 704. It is pointed out that the amount of current that flows through the breakdown voltage blocking device 702 is controlled by the voltage applied to its gate. As such, the gate of the breakdown voltage blocking device 702 can be coupled to a different voltage within circuit 700 to increase or decrease the amount of current that flows through the breakdown voltage blocking device 702 and into the drain of the power MOSFET device 704.

Within FIG. 7, the circuit 700 can include, but is not limited to, the breakdown voltage blocking device 702 coupled with the power MOSFET device 704. Specifically, the gate of the breakdown voltage blocking device 702 can be coupled to the source of the power MOSFET device 704. In addition, the source of the breakdown voltage blocking device 702 can be coupled to the drain of the power MOSFET device 704. In an embodiment, the drain of the breakdown voltage blocking device 702 can be coupled to a high voltage while the source of the power MOSFET device 704 can be coupled to one or more circuit devices.

It is noted that the circuit 700 can be implemented in a wide variety of ways. For example, in an embodiment, the breakdown voltage blocking device 702 can be located above the power MOSFET device 704 instead of being located below it as shown within the present embodiment. Therefore, the drain of the breakdown voltage blocking device 702 can be coupled to the source of the power MOSFET device 704 while the gate of the breakdown voltage blocking device 702 can be coupled to the drain of the power MOSFET device 704. In one embodiment, the source of the breakdown voltage blocking device 702 can be coupled to a high voltage while the drain of the power MOSFET device 704 can be coupled to one or more circuit devices.

It is noted that the circuit 700 may not include all of the elements illustrated by FIG. 7. Furthermore, the circuit 700 can be implemented to include one or more elements not illustrated by FIG. 7. Note that the circuit 700 can be utilized or implemented in any manner similar to that described herein, but is not limited to such.

Figure 8:
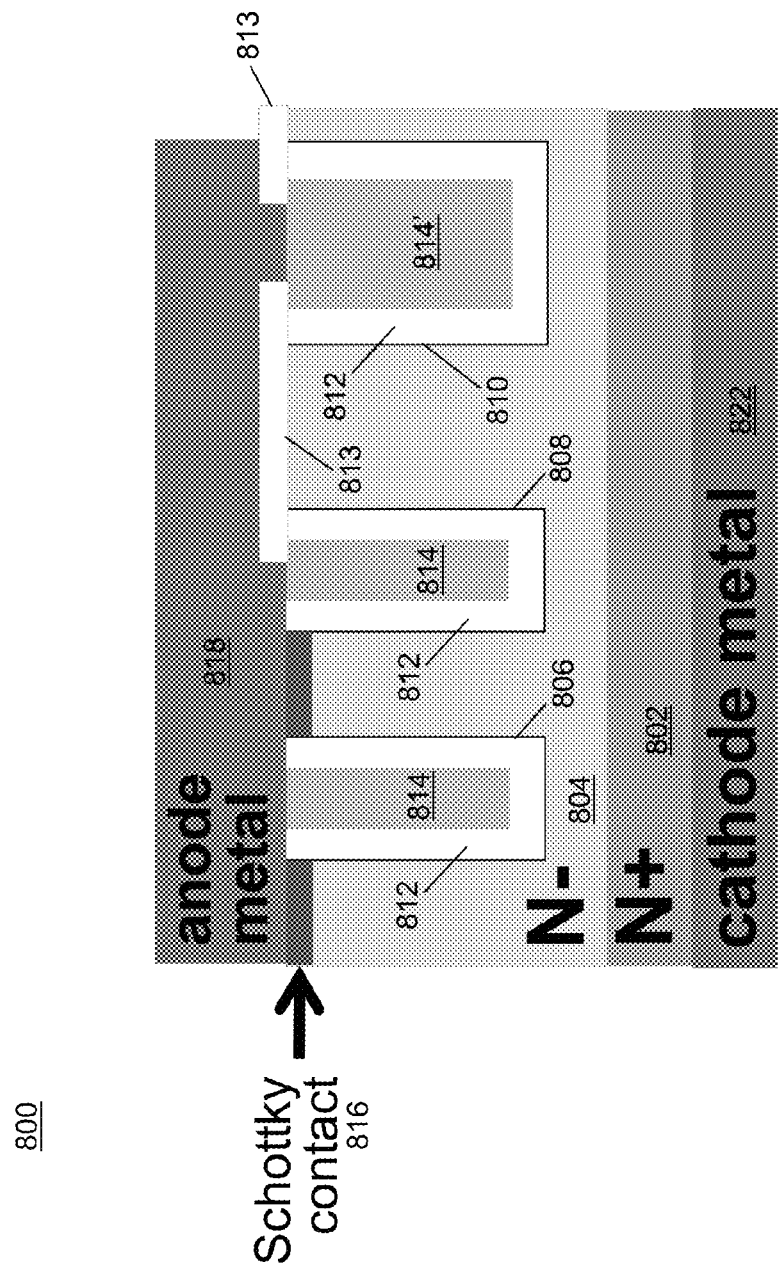
FIG. 8 is a side sectional view of a high voltage Schottky diode in accordance with various embodiments of the invention.

FIG. 8 is a side sectional view of an N-type high voltage Schottky diode 800 in accordance with various embodiments of the invention. In various embodiments, the breakdown voltage rating of the N-type high voltage Schottky diode 800 can be tuned or established by one or more of its different structural components. For example, the breakdown voltage rating of the N-type high voltage Schottky diode 800 can be tuned or established with, but is not limited to, the depth of its trenches (e.g., 806, 808, and 810), the thickness of the dielectric layer (e.g., 812) within those trenches, the doping of the N− doped epitaxial layer (e.g., 804), and/or the thickness of the N− doped epitaxial layer (e.g., 804) located between the bottom of the trenches and its N+ doped substrate (e.g., 802). Note that in an embodiment, if the thickness of the N− doped epitaxial layer 804 is increased between the bottom of the trenches 806, 808, and 810 and the N+ doped substrate 802 for a given breakdown voltage, the thickness of the dielectric layer 812 can be reduced within the trenches 806, 808, and 810.

In an embodiment, if the doping of the N− doped epitaxial layer 804 between the trenches 806 and 808 for a given dielectric 812 thickness and trench depth is optimized, the highest blocking voltage can be achieved by the N-type high voltage Schottky diode 800. Moreover, the greater the depth of the trenches 806 and 808, the higher blocking voltage can be achieved by the N-type high voltage Schottky diode 800 if its voltage drop on the dielectric 812 is within its rupture limit. However, if the doping of the N− doped epitaxial layer 804 is more or less doped than this optimized doping, the N-type high voltage Schottky diode 800 can block less voltage. Furthermore, the N-type high voltage Schottky diode 800 can block more voltage the greater the thickness of the N− doped epitaxial layer 804 located between the N+ doped substrate 802 and the bottom of the trenches 806, 808, and 810.

In one embodiment, the trenches 806, 808, and 810 of the N-type high voltage Schottky diode 800 can each be referred to as a very deep trench. It is pointed out that the dielectric layer 812 within each of the trenches 806, 808, and 810 can be thermally grown, or deposited via chemical vapor deposition, or formed by any combination thereof, but is not limited to such.

In an embodiment, the N-type high voltage Schottky diode 800 of FIG. 8 can include, but is not limited to, the N+ substrate 802, the N− doped epitaxial region or layer 804, the trenches 806, 808, and 810, the Schottky contacts 816, the anode metal 818, and the cathode metal 822. Specifically in an embodiment, the trenches 806, 808, and 810 can be formed within the N− doped epitaxial layer 804. Furthermore, the trenches 806 and 808 can each include the dielectric layer 812 (e.g., oxide) that surrounds the conductive region 814 (e.g., polysilicon). The anode metal 818 can be formed above or over the Schottky contacts 816, the dielectric layer 812 and the conductive region 814 located within the trenches 806 and 808, and the dielectric layer 812 and the conductive region 814' located within the trench 810 and form the Schottky contacts 816 with the N-doped epitaxial layer 804 and ohmic contact with the conductive regions 814 and 814'. In addition, the anode metal 818 can be formed over and between dielectric regions or layer 813 (e.g. oxide).

Within the N-type high voltage Schottky diode 800, the trench 810 can include the dielectric layer 812 (e.g., oxide) and the conductive region 814' (e.g., polysilicon). In one embodiment, the Schottky contacts 816 can be formed within a portion of the upper surface of the N− doped epitaxial layer 804 in between and near the trenches 806 and 808. Furthermore, the Schottky contacts 816 can be formed between the anode metal 818 and the N− doped epitaxial layer 804. In an embodiment, dielectric regions or layer 813

(e.g., oxide) can be formed above the N– doped epitaxial layer 804 and the trenches 808 and 810. The cathode metal 822 can be located below the N+ substrate 802 and form ohmic contact with the N+ substrate 802.

Note that the N-type high voltage Schottky diode 800 may not include all of the elements illustrated by FIG. 8. Additionally, the N-type high voltage Schottky diode 800 can be implemented to include one or more elements not illustrated by FIG. 8. It is pointed out that the N-type high voltage Schottky diode 800 can be utilized or implemented in any manner similar to that described herein, but is not limited to such.

Figure 9:
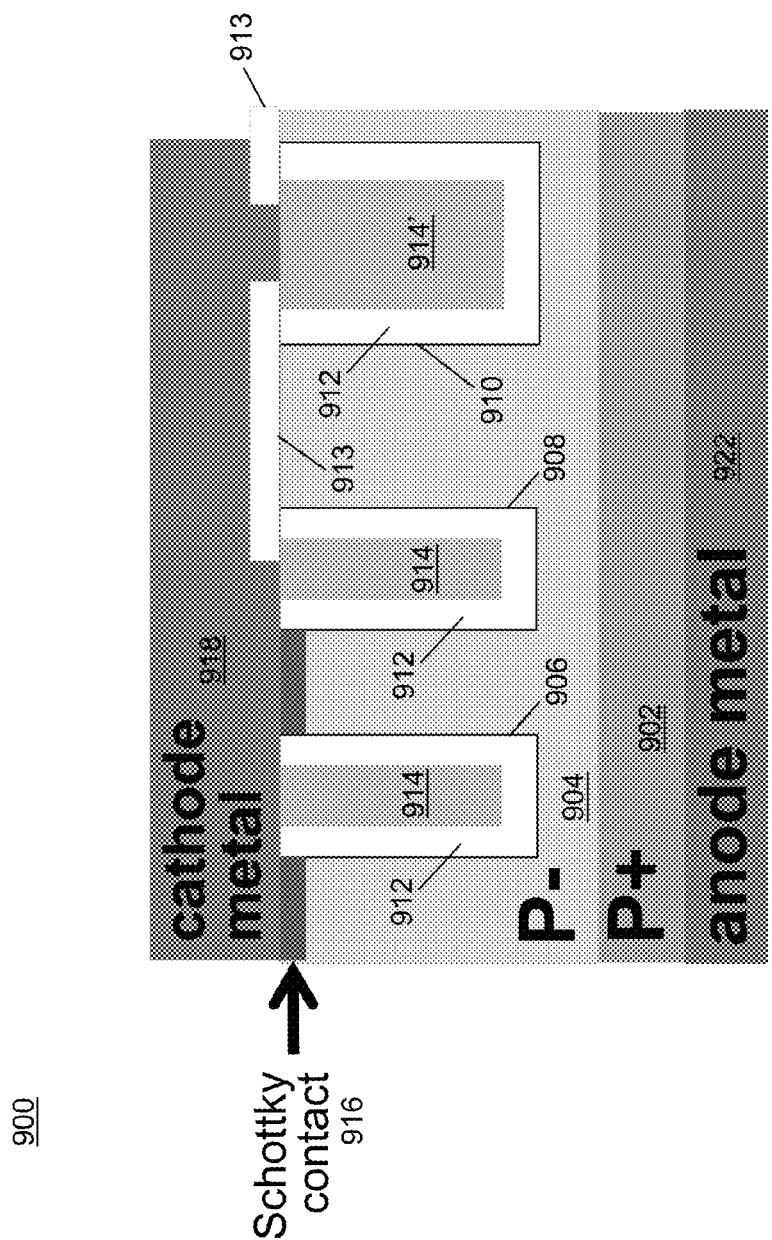
FIG. 9 is a side sectional view of another high voltage Schottky diode in accordance with various embodiments of the invention.

FIG. 9 is a side sectional view of a P-type high voltage Schottky diode 900 in accordance with various embodiments of the invention. In various embodiments, the breakdown voltage rating of the P-type high voltage Schottky diode 900 can be tuned or established by one or more of its different structural components. For example, the breakdown voltage rating of the P-type high voltage Schottky diode 900 can be tuned or established with, but is not limited to, the depth of its trenches (e.g., 906, 908, and 910), the thickness of the dielectric layer (e.g., 912) within those trenches, the doping of the P– doped epitaxial layer (e.g., 904), and/or the thickness of the P– doped epitaxial layer (e.g., 904) located between the bottom of the trenches and its P+ doped substrate (e.g., 902). It is noted that in an embodiment, if the thickness of the P– doped epitaxial layer 904 is increased between the bottom of the trenches 906, 908, and 910 and the P+ doped substrate 902 for a given breakdown voltage, the thickness of the dielectric layer 912 can be reduced within the trenches 906, 908, and 910.

In an embodiment, if the doping of the P– doped epitaxial layer 904 between the trenches 906 and 908 for a given dielectric 912 thickness and trench depth is optimized, the highest blocking voltage can be achieved by the P-type high voltage Schottky diode 900. Moreover, the greater the depth of the trenches 906 and 908, the higher blocking voltage can be achieved by the P-type high voltage Schottky diode 900 if its voltage drop on the dielectric 912 is within its rupture limit. However, if the doping of the P– doped epitaxial layer 904 is more or less doped than this optimized doping, the P-type high voltage Schottky diode 900 can block less voltage. Furthermore, the P-type high voltage Schottky diode 900 can block more voltage the greater the thickness of the P– doped epitaxial layer 904 located between the P+ doped substrate 902 and the bottom of the trenches 906, 908, and 910.

In one embodiment, the trenches 906, 908, and 910 of the P-type high voltage Schottky diode 900 can each be referred to as a very deep trench. It is noted that the dielectric layer 912 within each of the trenches 906, 908, and 910 can be thermally grown, or deposited via chemical vapor deposition, or formed by any combination thereof, but is not limited to such.

In an embodiment, the P-type high voltage Schottky diode 900 of FIG. 9 can include, but is not limited to, the P+ substrate 902, the P– doped epitaxial region or layer 904, the trenches 906 and 908, the Schottky contacts 916, the cathode metal 918, the trench 910, and the anode metal 922. Specifically in one embodiment, the trench 910 and the trenches 906 and 908 can be formed within the P– doped epitaxial layer 904. Moreover, the trenches 906 and 908 can each include the dielectric layer 912 (e.g., oxide) that surrounds the conductive region 914 (e.g., polysilicon). The cathode metal 918 can be formed above or over the Schottky contacts 916, the dielectric layer 912 and the conductive region 914 located within the trenches 906 and 908, and the dielectric layer 912 and the conductive region 914' located within the trench 910 and form the Schottky contacts 916 with the P– doped epitaxial layer 904 and ohmic contact with the conductive regions 914 and 914'. In addition, the cathode metal 918 can be formed over and between dielectric regions or layer 913 (e.g. oxide).

Within the P-type high voltage Schottky diode 900, the trench 910 can include the dielectric layer 912 (e.g., oxide) and the conductive region 914' (e.g., polysilicon). In an embodiment, the Schottky contacts 916 can be formed within a portion of the upper surface of the P– doped epitaxial layer 904 in between and near the trenches 906 and 908. In addition, the Schottky contacts 916 can be formed between the cathode metal 918 and the P– doped epitaxial layer 904. In an embodiment, dielectric regions or layer 913 (e.g., oxide) can be formed above the P– doped epitaxial layer 904 and the trenches 908 and 910. The anode metal 922 can be located below the P+ substrate 902 and form ohmic contact with the P+ substrate 902.

It is pointed out that the P-type high voltage Schottky diode 900 may not include all of the elements illustrated by FIG. 9. Furthermore, the P-type high voltage Schottky diode 900 can be implemented to include one or more elements not illustrated by FIG. 9. It is noted that the P-type high voltage Schottky diode 900 can be utilized or implemented in any manner similar to that described herein, but is not limited to such.

Figure 10:
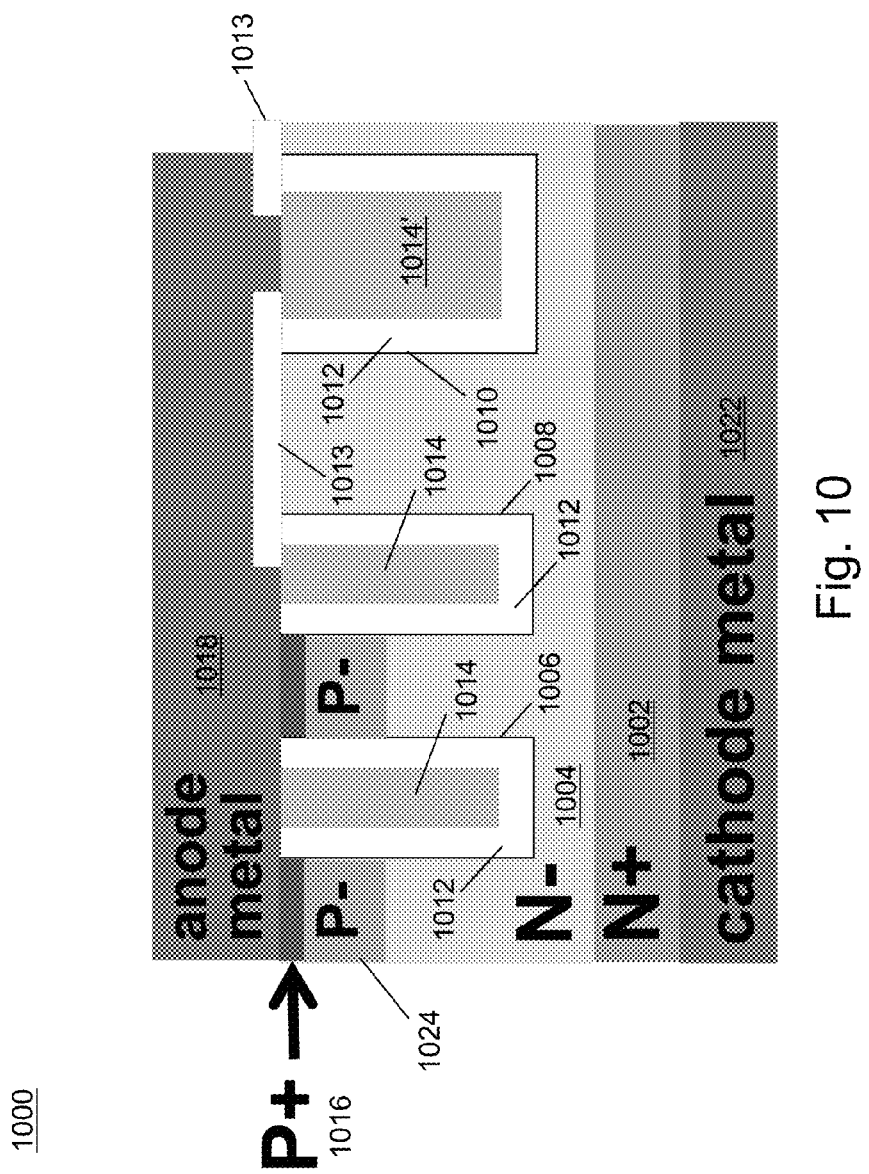
FIG. 10 is a side sectional view of a high voltage diode in accordance with various embodiments of the invention.

FIG. 10 is a side sectional view of a high voltage diode 1000 in accordance with various embodiments of the invention. In various embodiments, the breakdown voltage rating of the high voltage diode 1000 can be tuned or established by one or more of its different structural components. For example, the breakdown voltage rating of the high voltage diode 1000 can be tuned or established with, but is not limited to, the depth of its trenches (e.g., 1006, 1008, and 1010), the thickness of the dielectric layer (e.g., 1012) within those trenches, the doping of the N– doped epitaxial layer (e.g., 1004), and/or the thickness of the N– doped epitaxial layer (e.g., 1004) located between the bottom of the trenches and its N+ doped substrate (e.g., 1002). It is pointed out that in an embodiment, if the thickness of the N– doped epitaxial layer 1004 is increased between the bottom of the trenches 1006, 1008, and 1010 and the N+ doped substrate 1002 for a given breakdown voltage, the thickness of the dielectric layer 1012 can be reduced within the trenches 1006, 1008, and 1010.

In an embodiment, if the doping of the N– doped epitaxial layer 1004 between the trenches 1006 and 1008 for a given dielectric 1012 thickness and trench depth is optimized, the highest blocking voltage can be achieved by the high voltage diode 1000. Moreover, the greater the depth of the trenches 1006 and 1008, the higher blocking voltage can be achieved by the high voltage diode 1000 if its voltage drop on the dielectric 1012 is within its rupture limit. However, if the doping of the N– doped epitaxial layer 1004 is more or less doped than this optimized doping, the high voltage diode 1000 can block less voltage. Furthermore, the high voltage diode 1000 can block more voltage the greater the thickness of the N– doped epitaxial layer 1004 located between the N+ doped substrate 1002 and the bottom of the trenches 1006, 1008, and 1010.

In one embodiment, the trenches 1006, 1008, and 1010 of the high voltage diode 1000 can each be referred to as a very deep trench. Note that the dielectric layer 1012 within each of the trenches 1006, 1008, and 1010 can be thermally grown, or deposited via chemical vapor deposition, or formed by any combination thereof, but is not limited to such.

In an embodiment, the high voltage diode 1000 of FIG. 10 can include, but is not limited to, the N+ substrate 1002, the N− doped epitaxial region or layer 1004, the trenches 1006 and 1008, the P− doped regions 1024, the P+ doped regions or layer 1016, the anode metal 1018, the trench 1010, and the cathode metal 1022. Specifically in an embodiment, the trench 1010 and the trenches 1006 and 1008 can be formed within the N− doped epitaxial layer 1004. In addition, the trenches 1006 and 1008 can each include the dielectric layer 1012 (e.g., oxide) that surrounds the conductive region 1014 (e.g., polysilicon). The anode metal 1018 can be deposited and formed above or over the P+ doped ohmic contacts 1016, the dielectric layer 1012 and the conductive region 1014 located within the trenches 1006 and 1008, and the dielectric layer 1012 and the conductive region 1014' located within the trench 1010. In addition, the anode metal 1018 can be formed over and between dielectric regions or layer 1013 (e.g. oxide).

Within the high voltage diode 1000, the trench 1010 can include the dielectric layer 1012 (e.g., oxide) and the conductive region 1014' (e.g., polysilicon). In one embodiment, the P− doped regions 1024 can be formed within a portion of the N− doped epitaxial layer 1004 in between and near the trenches 1006 and 1008. Moreover, the P+ doped regions or layer 1016 can be formed within a portion of the upper surface of the P− doped regions 1024 in between and near the trenches 1006 and 1008. Furthermore, the P+ doped regions or layer 1016 can form ohmic contact with the anode metal 1018. In an embodiment, dielectric regions or layer 1013 (e.g., oxide) can be formed above the N− doped epitaxial layer 1004 and the trenches 1008 and 1010. The cathode metal 1022 can be located below the N+ substrate 1002 and form ohmic contact with the N+ substrate 1002.

It is noted that the high voltage diode 1000 may not include all of the elements illustrated by FIG. 10. Additionally, the high voltage diode 1000 can be implemented to include one or more elements not illustrated by FIG. 10. Note that the high voltage diode 1000 can be utilized or implemented in any manner similar to that described herein, but is not limited to such.

Figure 11:
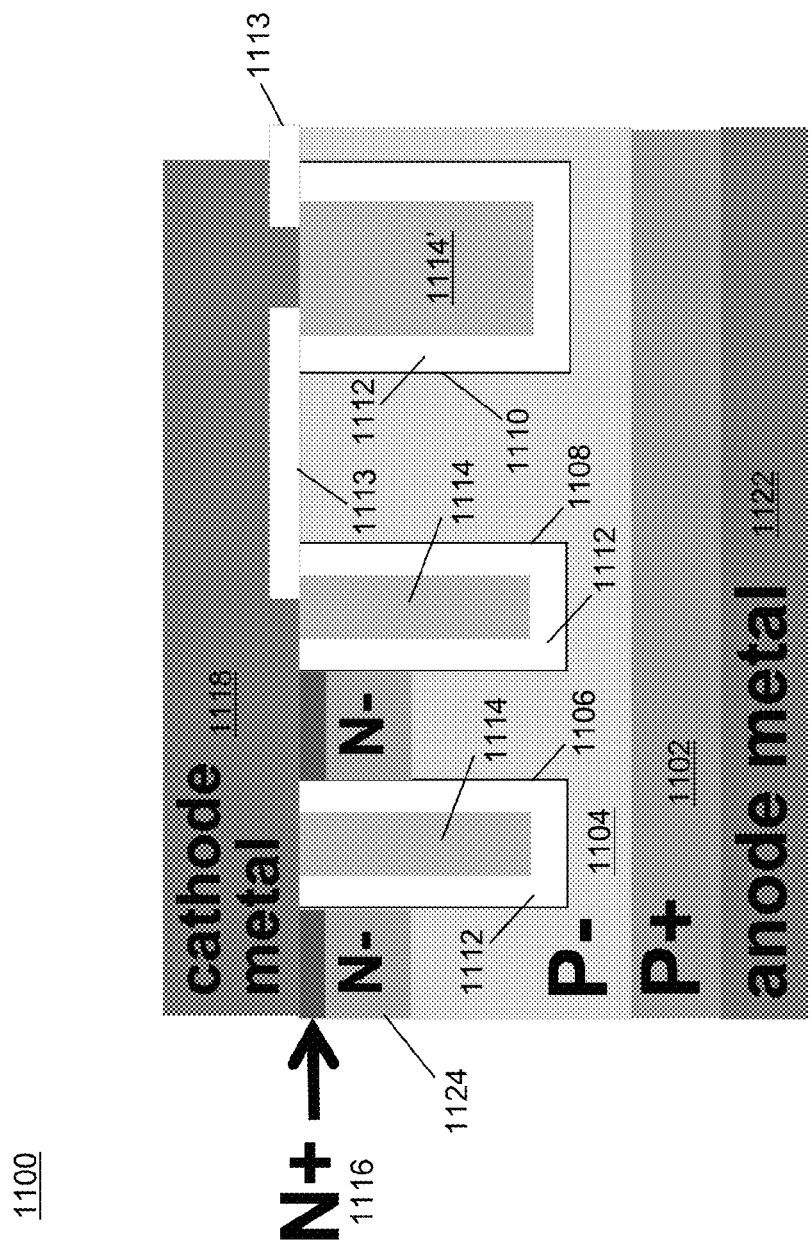
FIG. 11 is a side sectional view of another high voltage diode in accordance with various embodiments of the invention.

FIG. 11 is a side sectional view of a high voltage diode 1100 in accordance with various embodiments of the invention. In various embodiments, the breakdown voltage rating of the high voltage diode 1100 can be tuned or established by one or more of its different structural components. For example, the breakdown voltage rating of the high voltage diode 1100 can be tuned or established with, but is not limited to, the depth of its trenches (e.g., 1106, 1108, and 1110), the thickness of the dielectric layer (e.g., 1112) within those trenches, the doping of the P− doped epitaxial layer (e.g., 1104), and/or the thickness of the P− doped epitaxial layer (e.g., 1104) located between the bottom of the trenches and its P+ doped substrate (e.g., 1102). Note that in an embodiment, if the thickness of the P− doped epitaxial layer 1104 is increased between the bottom of the trenches 1106, 1108, and 1110 and the P+ doped substrate 1102 for a given breakdown voltage, the thickness of the dielectric layer 1112 can be reduced within the trenches 1106, 1108, and 1110.

In an embodiment, if the doping of the P− doped epitaxial layer 1104 between the source trenches 1106 and 1108 for a given dielectric 1112 thickness and trench depth is optimized, the highest blocking voltage can be achieved by the high voltage diode 1100. Moreover, the greater the depth of the trenches 1106 and 1108, the higher blocking voltage can be achieved by the high voltage diode 1100 if its voltage drop on the dielectric 1112 is within its rupture limit. However, if the doping of the P− doped epitaxial layer 1104 is more or less doped than this optimized doping, the high voltage diode 1100 can block less voltage. Furthermore, the high voltage diode 1100 can block more voltage the greater the thickness of the P− doped epitaxial layer 1104 located between the P+ doped substrate 1102 and the bottom of the trenches 1106, 1108, and 1110.

In one embodiment, the trenches 1106, 1108, and 1110 of the high voltage diode 1100 can each be referred to as a very deep trench. It is pointed out that the dielectric layer 1112 within each of the trenches 1106, 1108, and 1110 can be thermally grown, or deposited via chemical vapor deposition, or formed by any combination thereof, but is not limited to such.

In an embodiment, the high voltage diode 1100 of FIG. 11 can include, but is not limited to, the P+ substrate 1102, the P− doped epitaxial region or layer 1104, the trenches 1106 and 1108, the N− doped regions 1124, the N+ doped regions or layer 1116, the cathode metal 1118, the trench 1110, and the anode metal 1122. Specifically in one embodiment, the trenches 1106, 1108, and 1110 can be formed within the N-doped epitaxial layer 1104. Furthermore, the trenches 1106 and 1108 can each include the dielectric layer 1112 (e.g., oxide) that surrounds the conductive region 1114 (e.g., polysilicon). The cathode metal 1118 can be deposited and formed above or over the N+ doped ohmic contacts 1116, the dielectric layer 1112 and the conductive region 1114 located within the trenches 1106 and 1108, and the dielectric layer 1112' and the conductive region 1114' located within the trench 1110. In addition, the cathode metal 1118 can be formed over and between dielectric regions or layer 1113 (e.g. oxide).

Within the high voltage diode 1100, the trench 1110 can include the dielectric layer 1112' (e.g., oxide) and the conductive region 1114' (e.g., polysilicon). In an embodiment, the N− doped regions 1124 can be formed within a portion of the P− doped epitaxial layer 1104 in between and near the trenches 1106 and 1108. In addition, the N+ doped regions or layer 1116 can be formed within a portion of the upper surface of the N− doped regions 1124 in between and near the trenches 1106 and 1108. Furthermore, the N+ doped regions or layer 1116 can form ohmic contact with the cathode metal 1118. In an embodiment, dielectric regions or layer 1113 (e.g., oxide) can be formed above the P− doped epitaxial layer 1104 and the trenches 1108 and 1110. The anode metal 1122 can be located below the P+ substrate 1102 and form ohmic contact with the P+ substrate 1102.

Note that the high voltage diode 1100 may not include all of the elements illustrated by FIG. 11. Moreover, the high voltage diode 1100 can be implemented to include one or more elements not illustrated by FIG. 11. It is pointed out that the high voltage diode 1100 can be utilized or implemented in any manner similar to that described herein, but is not limited to such.

Figure 12:
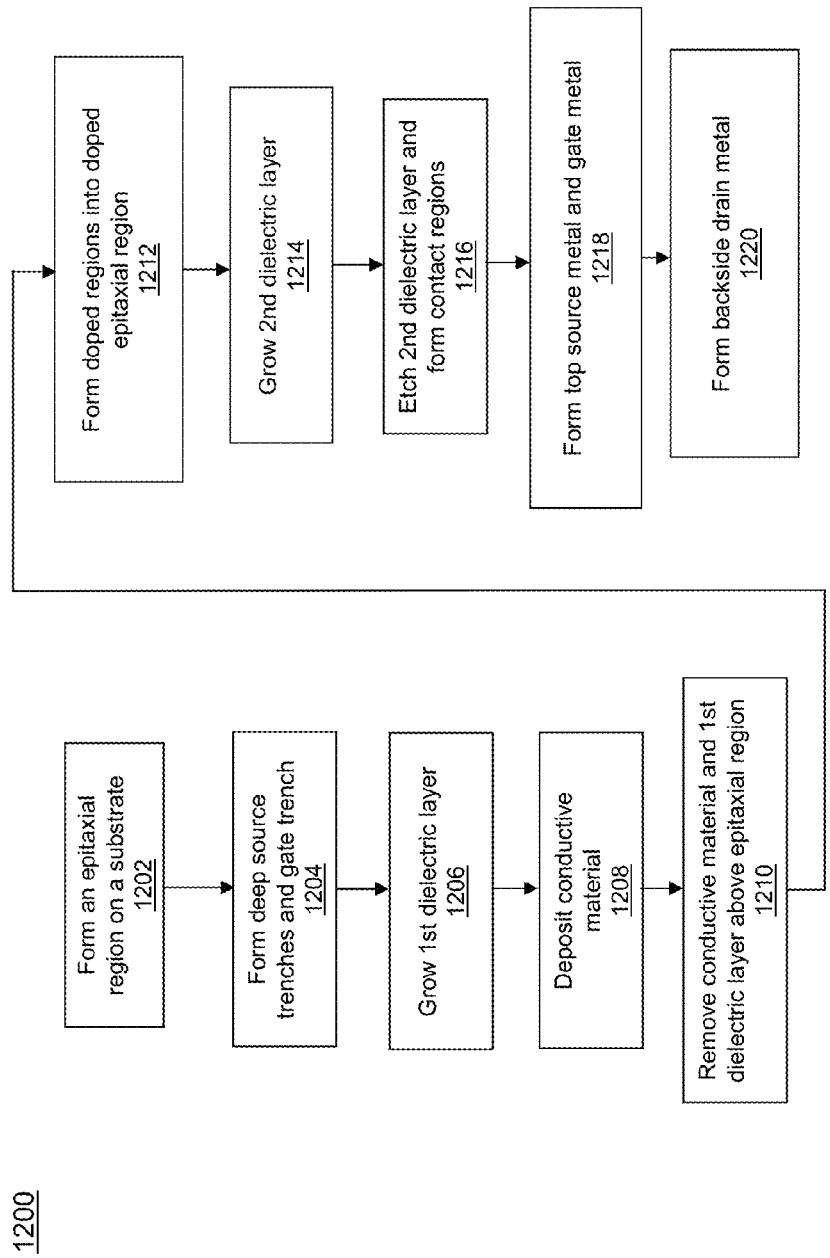
FIG. 12 is flow diagram of a method in accordance with various embodiments of the invention.

FIG. 12 is flow diagram of a method 1200 in accordance with various embodiments of the invention for fabricating a breakdown voltage blocking device. Although specific operations are disclosed in FIG. 12, such operations are examples. The method 1200 may not include all of the operations illustrated by FIG. 12. Also, method 1200 may include various other operations and/or variations of the operations shown. Likewise, the sequence of the operations of flow diagram 1200 can be modified. It is appreciated that not all of the operations in flow diagram 1200 may be performed. In various embodiments, one or more of the operations of method 1200 can be controlled or managed by software, by firmware, by hardware or by any combination thereof, but is not limited to such. Method 1200 can include processes of embodiments of the invention which can be controlled or managed by a processor(s) and electrical components under the control of computer or computing device readable and executable instructions (or code). The computer or computing device readable and executable instructions (or code) may reside, for example, in data storage features such as computer or computing device usable volatile memory, computer or computing device usable non-volatile memory, and/or computer or computing device usable mass data storage. However, the computer or computing device readable and executable instructions (or code) may reside in any type of computer or computing device readable medium or memory.

Figure 13:
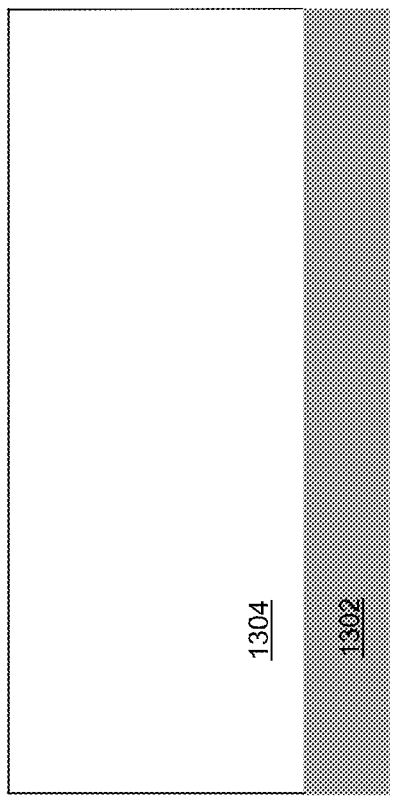

At operation 1202, a doped epitaxial region (e.g., 104, 204, 304, 404, 504, or 604) can be formed on or above a substrate (e.g., 102, 202, 302, 402, 502, or 602). Note that in one embodiment, the substrate and the doped epitaxial region can be collectively referred to as a substrate, but are not limited to such. It is pointed out that operation 1202 can be implemented in a wide variety of ways. For example, in an embodiment, FIG. 13 illustrates a side sectional view of a doped epitaxial region 1304 formed on or above a substrate 1302 at operation 1202. Note that operation 1202 can be implemented in any manner similar to that described herein, but is not limited to such.

Figure 14:
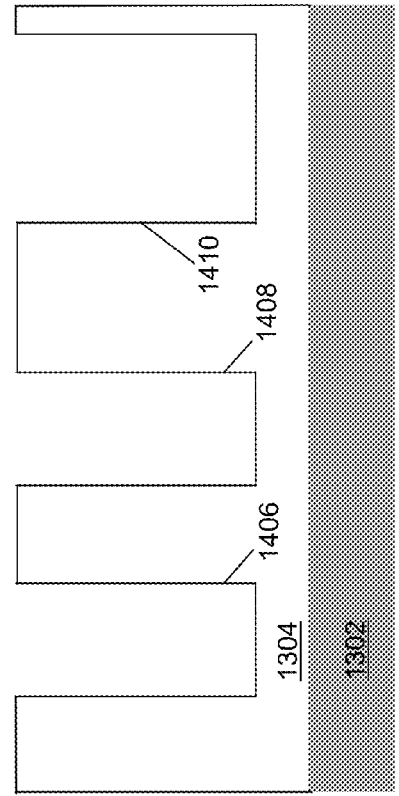

At operation 1204 of FIG. 12, a plurality of source trenches (e.g., 106 and 108, 206 and 208, 306 and 308, 406 and 408, 506 and 508, or 606 and 608) and a gate trench (e.g., 110, 210, 310, 410, 510, or 610) can be formed or deep etched into the doped epitaxial region. It is noted that operation 1204 can be implemented in a wide variety of ways. For example, in an embodiment, FIG. 14 illustrates source trenches 1406 and 1408 and a gate trench 1410 formed or deep etched into the doped epitaxial region 1304 at operation 1204. Note that operation 1204 can be implemented in any manner similar to that described herein, but is not limited to such.

Figure 15:
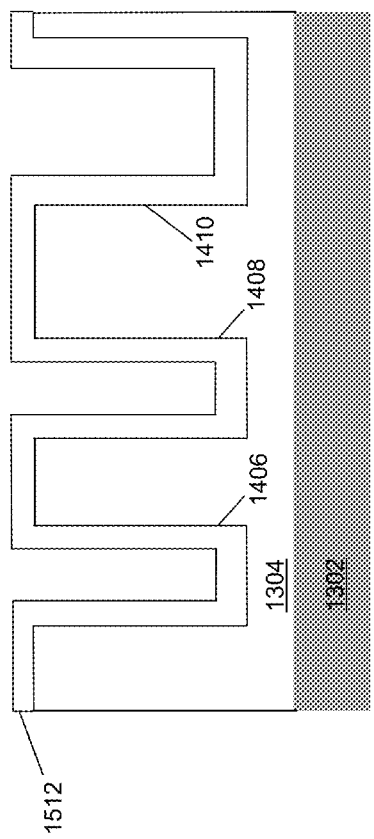

At operation 1206, a first dielectric layer (e.g., 112, 212, 312, 412, 512, or 612) can be thermally grown, or deposited, or formed by any combination thereof above the doped epitaxial region and within the source trenches and the gate trench. Note that operation 1206 can be implemented in a wide variety of ways. For example, in an embodiment, FIG. 15 illustrates a first dielectric layer 1512 thermally grown, or deposited, or formed by any combination thereof above the doped epitaxial region 1304 and within the source trenches 1406 and 1408 and the gate trench 1410 at operation 1206. Note that in an embodiment, the first dielectric layer at operation 1206 can be an oxide, but is not limited to such. It is noted that operation 1206 can be implemented in any manner similar to that described herein, but is not limited to such.

Figure 16:
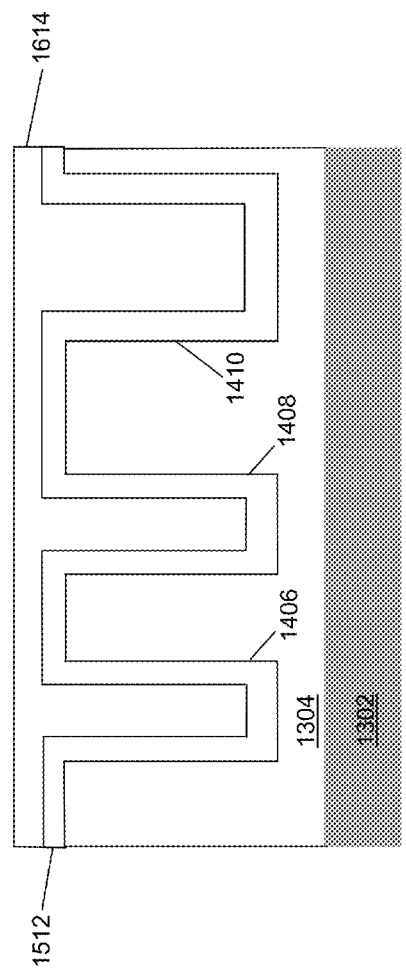

At operation 1208 of FIG. 12, a conductive material (e.g., 114, 114', 214, 214', 314, 314', 414, 414', 514, 514', 614, and/or 614') can be deposited above the first dielectric layer and into the source trenches and the gate trench. It is noted that operation 1208 can be implemented in a wide variety of ways. For example, in an embodiment, FIG. 16 illustrates a conductive material 1614 deposited above the first dielectric layer 1512 and into the source trenches 1406 and 1408 and the gate trench 1410 at operation 1208. Note that in an embodiment, the conductive material at operation 1208 can be a polysilicon, but is not limited to such. Operation 1208 can be implemented in any manner similar to that described herein, but is not limited to such.

Figure 17:
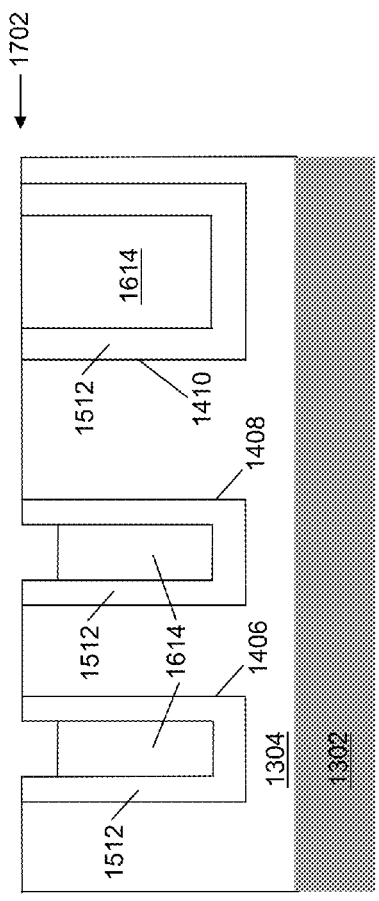

At operation 1210, the conductive material (e.g., 114, 114', 214, 214', 314, 314', 414, 414', 514, 514', 614, and/or 614') and the first dielectric layer (e.g., 112, 212, 312, 412, 512, or 612) can be removed by chemical-mechanical polishing (CMP) or etching from above the epitaxial region. At operation 1210, an etch-back can be performed to remove a portion of the conductive material from the source trenches. Note that operation 1210 can be implemented in a wide variety of ways. For example, in an embodiment, FIG. 17 illustrates the conductive material 1614 and the first dielectric layer 1512 removed by chemical-mechanical polishing (CMP) or etching from above the epitaxial region 1304 resulting in a substantially planarized surface 1702 and a portion of the conductive material 1614 etched back from the source trenches 1406 and 1408 at operation 1210. Operation 1210 can be implemented in any manner similar to that described herein, but is not limited to such.

Figure 18:
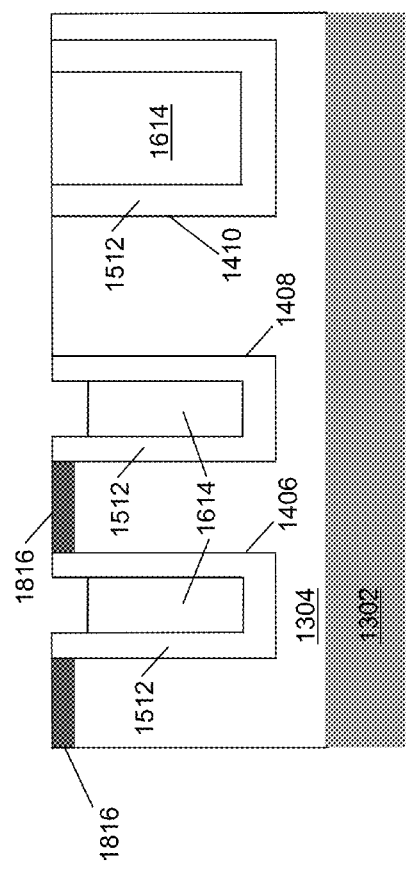

At operation 1212 of FIG. 12, doped regions (e.g., 116, 216, 516, 524, 616, or 624) can be formed into the doped epitaxial region located between and near the source trenches. It is noted that operation 1212 can be implemented in a wide variety of ways. For example, in an embodiment, FIG. 18 illustrates doped regions 1816 formed into the doped epitaxial region 1304 located between and near the source trenches 1406 and 1408 at operation 1212. In one embodiment, operation 1212 can be implemented with implantation, but is not limited to, an implant process. Note that operation 1212 can be implemented in any manner similar to that described herein, but is not limited to such.

At operation 1214, a second dielectric layer (e.g., 112, 212, 312, 412, 512, or 612) can be thermally grown, or deposited, or formed by any combination thereof above the doped regions, the doped epitaxial region, portions of the first dielectric layer, the conductive material, and within the source trenches. It is pointed out that operation 1214 can be implemented in a wide variety of ways. For example, in an embodiment, FIG. 19 illustrates a second dielectric layer 1912 thermally grown, or deposited, or formed by any combination thereof above the doped regions 1816, the doped epitaxial region 1304, portions of first dielectric layer 1512, the conductive material 1614, and within the source trenches 1406 and 1408 at operation 1214. It is noted that in an embodiment, the second dielectric layer at operation 1214 can be an oxide, but is not limited to such. Operation 1214 can be implemented in any manner similar to that described herein, but is not limited to such.

At operation 1216 of FIG. 12, the second dielectric layer can be etched to form contact regions above the doped regions (e.g., 116, 216, 516, or 616) or the Schottky contact regions (e.g., 316 or 416) and the gate conductive material (e.g., 114', 214', 314', 414', 514', or 614'). Note that operation 1216 can be implemented in a wide variety of ways. For example, in an embodiment, FIG. 20 illustrates the second dielectric layer 1912 etched to form contact regions 2002 above the doped regions (or the Schottky contact regions) 1816 and the conductive material 1614 located within the gate trench 1410 at operation 1216. Operation 1216 can be implemented in any manner similar to that described herein, but is not limited to such.

Figure 21:
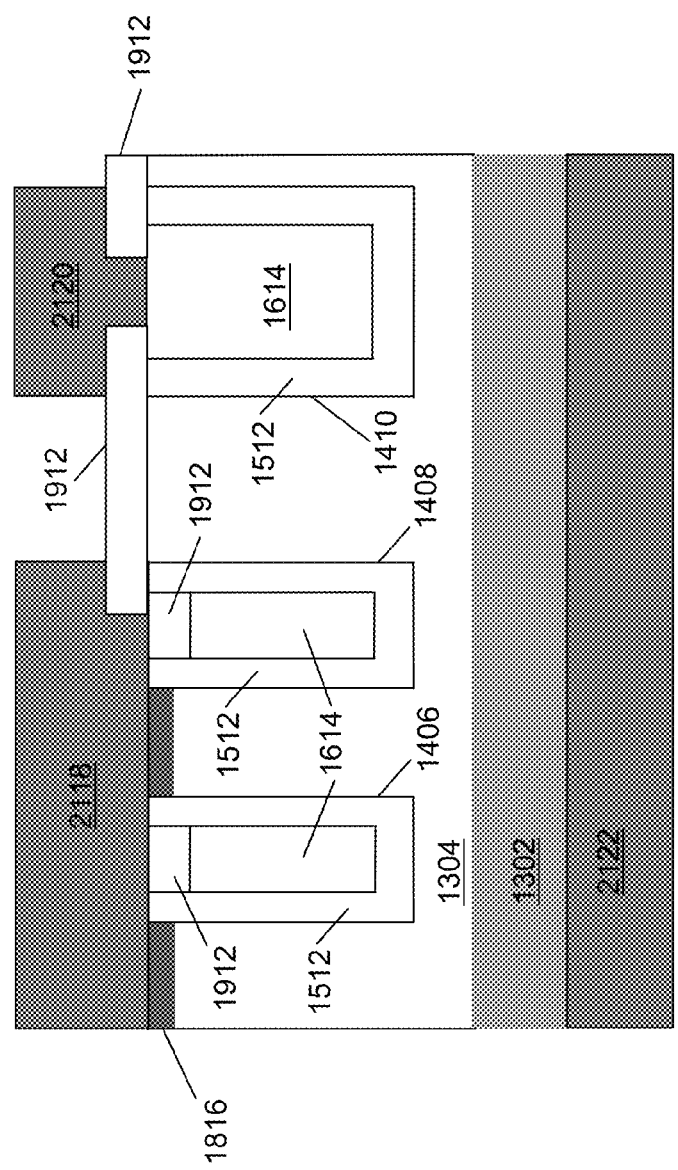

At operation 1218, a source metal (e.g., 118, 218, 318, 418, 518, or 618) and a gate metal (e.g., 120, 220, 320, 420, 520, or 620) can be formed on or above the contact regions. It is noted that operation 1218 can be implemented in a wide variety of ways. For example, in an embodiment, FIG. 21 illustrates the source metal 2118 and gate metal 2120 formed on or above the contact regions 2002 and the etched second dielectric layer 1912 at operation 1218. In an embodiment, it is noted that the combination of the first dielectric layer 1512 and the second dielectric layer 1912 located within the source trenches 1406 and 1408 may be referred to as a dielectric layer, but is not limited to such. Note that operation 1218 can be implemented in any manner similar to that described herein, but is not limited to such.

At operation 1220 of FIG. 12, a drain metal (e.g., 122, 222, 322, 422, 522, or 622) can be formed on the backside of the substrate. It is pointed out that operation 1220 can be implemented in a wide variety of ways. For example, in an embodiment, FIG. 21 illustrates a drain metal 2122 formed below the substrate 1302 at operation 1220. Operation 1220 can be implemented in any manner similar to that described herein, but is not limited to such. Once operation 1220 is completed, process 1200 can be ended or exited. In this manner, a breakdown voltage blocking device (e.g., 100, 200, 300, 400, 500, or 600) can be fabricated in accordance with various embodiments of the invention.

Figure 22:
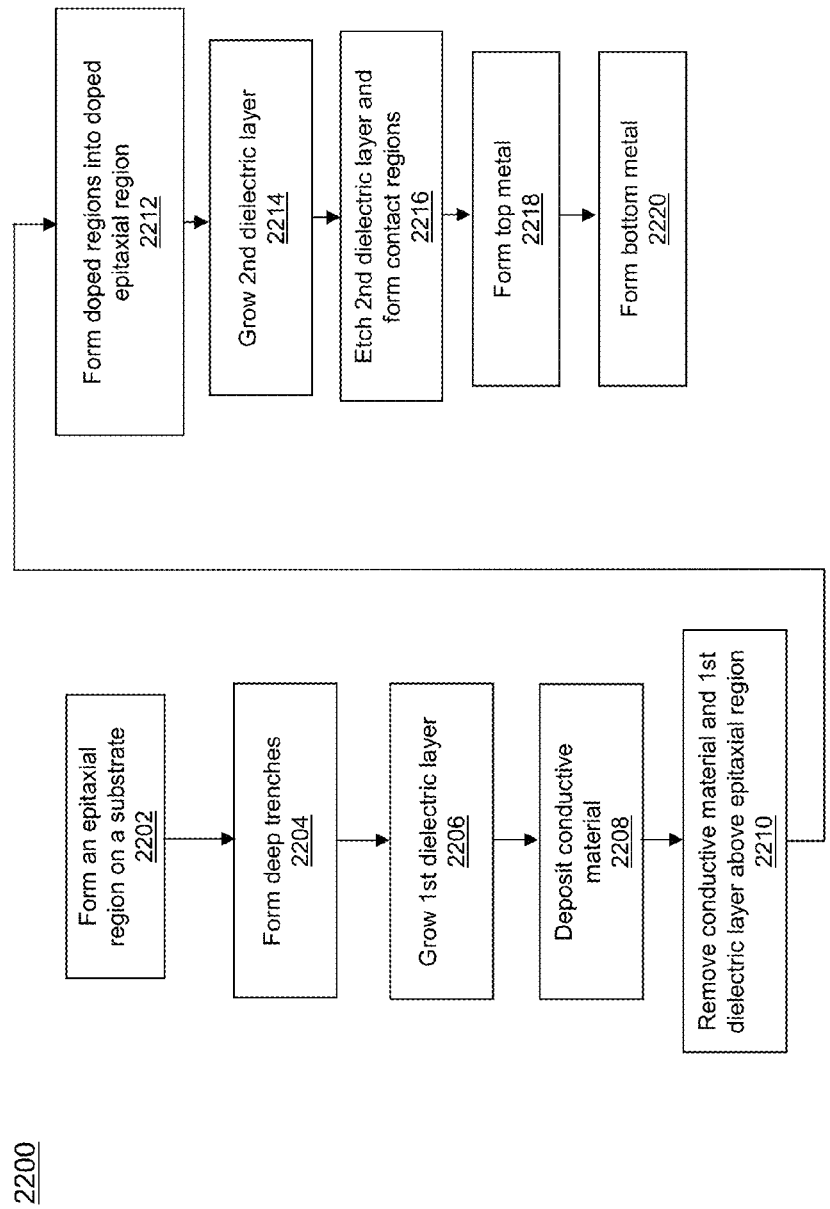
FIG. 22 is flow diagram of another method in accordance with various embodiments of the invention.

FIG. 22 is flow diagram of a method 2200 in accordance with various embodiments of the invention for fabricating a high voltage diode. Although specific operations are disclosed in FIG. 22, such operations are examples. The method 2200 may not include all of the operations illustrated by FIG. 22. Also, method 2200 may include various other operations and/or variations of the operations shown. Likewise, the sequence of the operations of flow diagram 2200 can be modified. It is appreciated that not all of the operations in flow diagram 2200 may be performed. In various embodiments, one or more of the operations of method 2200 can be controlled or managed by software, by firmware, by hardware or by any combination thereof, but is not limited to such. Method 2200 can include processes of embodiments of the invention which can be controlled or managed by a processor(s) and electrical components under the control of computer or computing device readable and executable instructions (or code). The computer or computing device readable and executable instructions (or code) may reside, for example, in data storage features such as computer or computing device usable volatile memory, computer or computing device usable non-volatile memory, and/or computer or computing device usable mass data storage. However, the computer or computing device readable and executable instructions (or code) may reside in any type of computer or computing device readable medium or memory.

Figure 23:
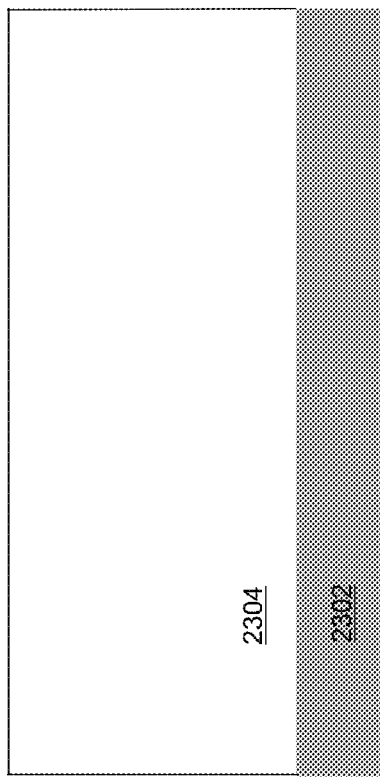
FIGS. 23, 24, 25, 26, 27, 28, 29, 30, and 31 are side sectional views of selected fabrication stages of a high voltage diode in accordance with various embodiments of the invention.

At operation 2202, a doped epitaxial region (e.g., 804, 904, 1004, or 1104) can be formed on or above a substrate (e.g., 802, 902, 1002, or 1102). Note that in one embodiment, the substrate and the doped epitaxial region can be collectively referred to as a substrate, but are not limited to such. It is pointed out that operation 2202 can be implemented in a wide variety of ways. For example, in an embodiment, FIG. 23 illustrates a side sectional view of a doped epitaxial region 2404 formed on or above a substrate 2302 at operation 2202. Note that operation 2202 can be implemented in any manner similar to that described herein, but is not limited to such.

Figure 24:
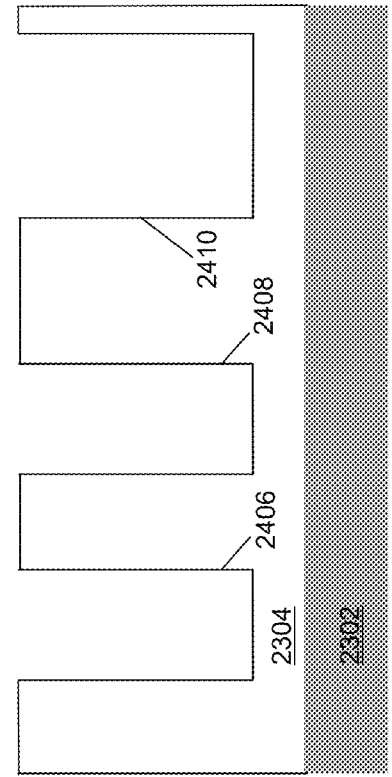

At operation 2204 of FIG. 22, a plurality of narrow trenches (e.g., 806 and 808, 906 and 908, 1006 and 1008, or 1106 and 1108) and a wide trench (e.g., 810, 910, 1010, or 1110) can be formed or deep etched into the doped epitaxial region. It is noted that operation 2204 can be implemented in a wide variety of ways. For example, in an embodiment, FIG. 24 illustrates narrow trenches 2406 and 2408 and a wide trench 2410 formed or deep etched into the doped epitaxial region 2304 at operation 2204. Within FIG. 24, it is pointed out that the width of each of the trenches 2406 and 2408 is narrower than the width of the trench 2410. Note that operation 2204 can be implemented in any manner similar to that described herein, but is not limited to such.

Figure 25:
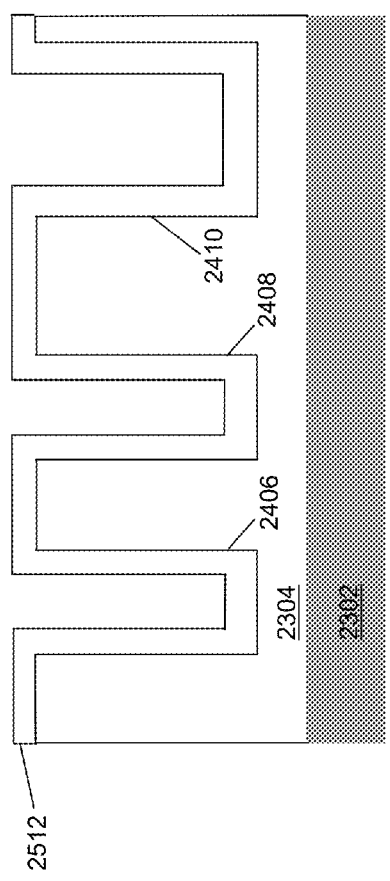

At operation 2206, a first dielectric layer (e.g., 812, 912, 1012, or 1112) can be thermally grown, or deposited, or formed by any combination thereof above the doped epitaxial region and within the narrow trenches and the wide trench. Note that operation 2206 can be implemented in a wide variety of ways. For example, in an embodiment, FIG. 25 illustrates a first dielectric layer 2512 thermally grown, or deposited, or formed by any combination thereof above the doped epitaxial region 2304 and within the narrow trenches 2406 and 2408 and the wide trench 2410 at operation 2206. Note that in an embodiment, the first dielectric layer at operation 2206 can be an oxide, but is not limited to such. It is noted that operation 2206 can be implemented in any manner similar to that described herein, but is not limited to such.

Figure 26:
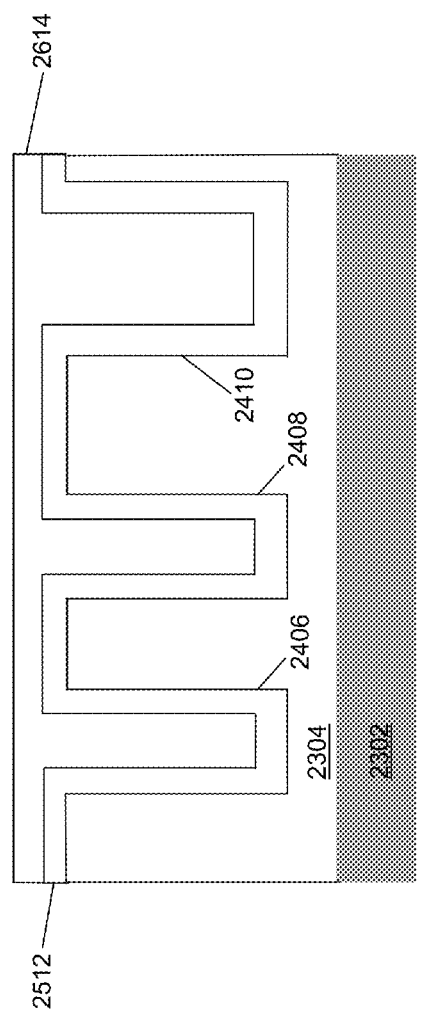

At operation 2208 of FIG. 22, a conductive material (e.g., 814, 814', 914, 914', 1014, 1014', 1114, and/or 1114') can be deposited above the first dielectric layer and into the narrow trenches and the wide trench. It is noted that operation 2208 can be implemented in a wide variety of ways. For example, in an embodiment, FIG. 26 illustrates a conductive material 2614 deposited above the first dielectric layer 2512 and into the narrow trenches 2406 and 2408 and the wide trench 2410 at operation 2208. It is noted that in one embodiment, the conductive material at operation 2208 can be a polysilicon, but is not limited to such. Operation 2208 can be implemented in any manner similar to that described herein, but is not limited to such.

Figure 27:
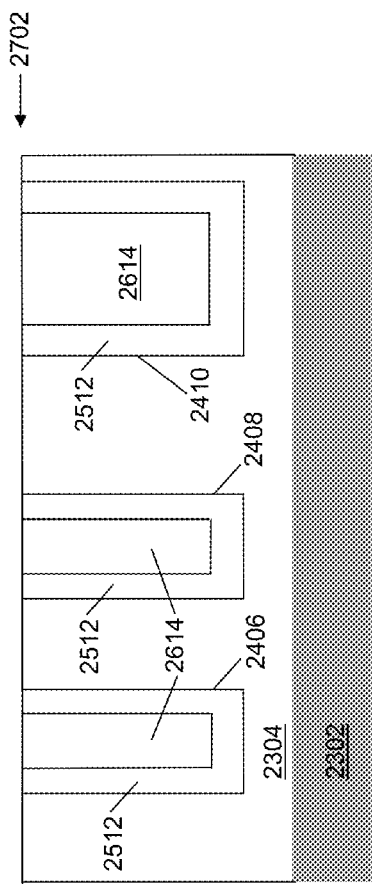

At operation 2210, the conductive material and the first dielectric layer can be removed by chemical-mechanical polishing (CMP) or etching from above the doped epitaxial region. Note that operation 2210 can be implemented in a wide variety of ways. For example, in an embodiment, FIG. 27 illustrates the conductive material 2614 and the first dielectric layer 2512 removed from above the doped epitaxial region 2304 at operation 2210 resulting in a substantially planarized surface 2702. In one embodiment, operation 2210 can be implemented with, but is not limited to, a chemical-mechanical polishing (CMP) process. Operation 2210 can be implemented in any manner similar to that described herein, but is not limited to such.

Figure 28:
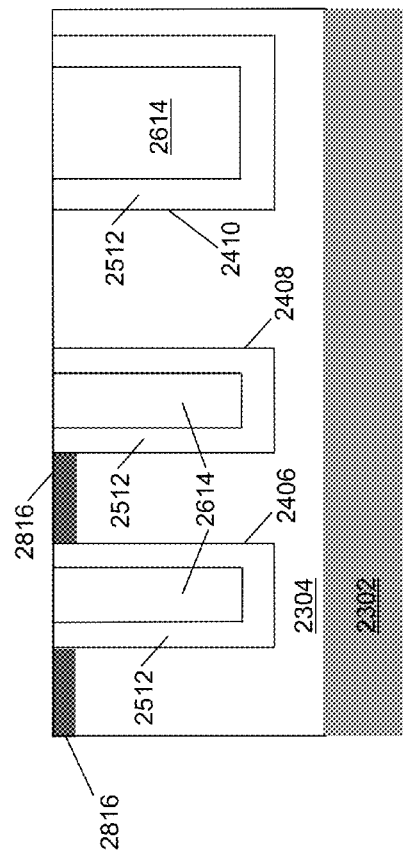

At operation 2212 of FIG. 22, doped regions (e.g., 1016, 1024, 1116, or 1124) can be formed by implantation and drive-in into the doped epitaxial region located between and near the narrow trenches. It is noted that operation 2212 can be implemented in a wide variety of ways. For example, in an embodiment, FIG. 28 illustrates doped regions 2816 formed into the doped epitaxial region 2304 located between and near the narrow trenches 2406 and 2408 at operation 2212. In one embodiment, operation 2212 can be implemented with, but is not limited to, an implantation and drive-in process. Note that operation 2212 can be implemented in any manner similar to that described herein, but is not limited to such.

Figure 29:
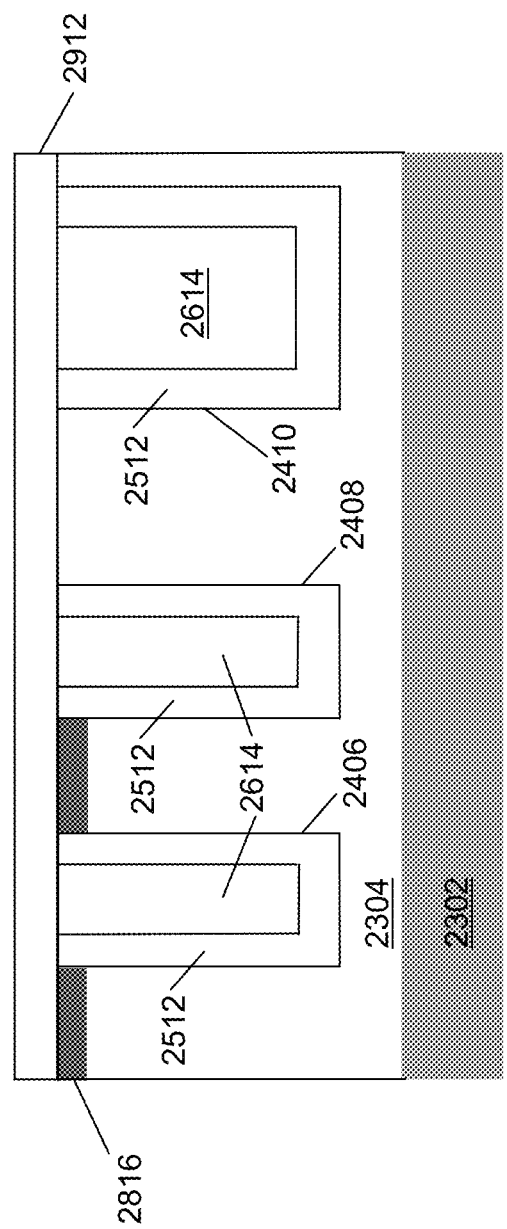

At operation 2214, a second dielectric layer (e.g., 812, 912, 1012, or 1112) can be thermally grown, or deposited, or formed by any combination thereof above the doped regions, the doped epitaxial region, portions of the first dielectric layer, and the conductive material. It is pointed out that operation 2214 can be implemented in a wide variety of ways. For example, in an embodiment, FIG. 29 illustrates a second dielectric layer 2912 thermally grown, or deposited, or formed by any combination thereof above the doped regions 2816, the doped epitaxial region 2304, portions of first dielectric layer 2512, and the conductive material 2614 at operation 2214. It is noted that in an embodiment, the second dielectric layer at operation 2214 can be an oxide, but is not limited to such. It is noted that operation 2214 can be implemented in any manner similar to that described herein, but is not limited to such.

Figure 30:
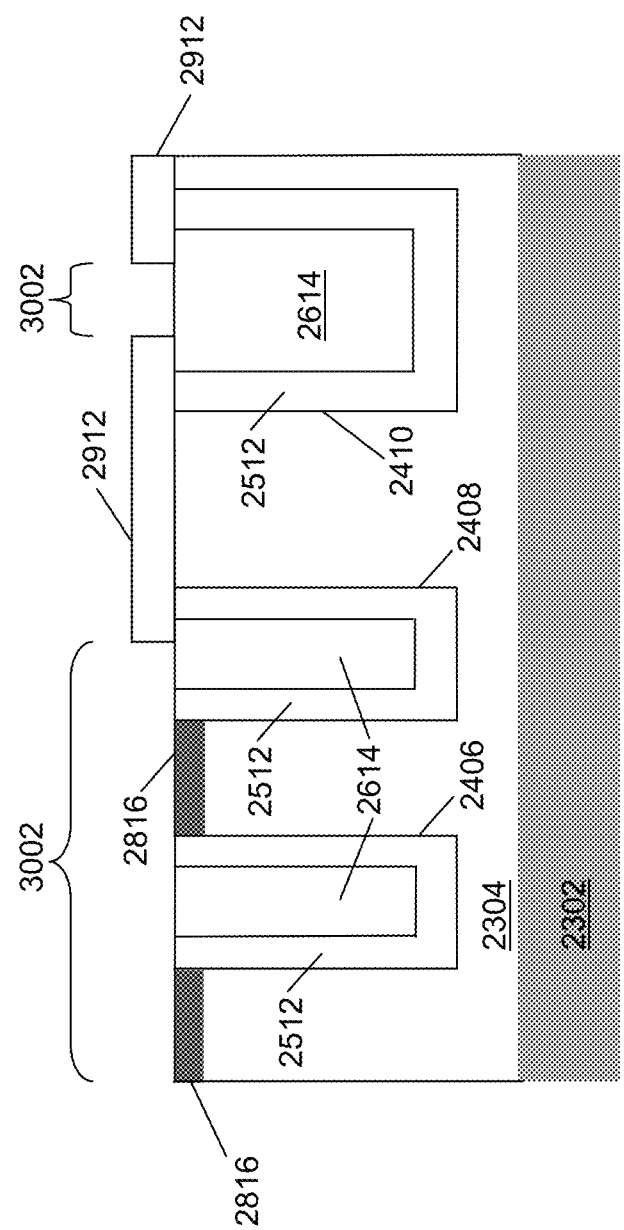

At operation 2216, the second dielectric layer can be etched to form contact regions above the doped regions (e.g., 1016 or 1116) or the Schottky contact regions (e.g., 816 or 916) and the conductive material (e.g., 814', 914', 1014', or 1114'). It is noted that operation 2216 can be implemented in a wide variety of ways. For example, in an embodiment, FIG. 30 illustrates the second dielectric layer 2912 etched to form contact regions 3002 above the doped regions (or the Schottky contact regions) 2816 and the conductive material 2614 at operation 2216. Note that operation 2216 can be implemented in any manner similar to that described herein, but is not limited to such.

Figure 31:
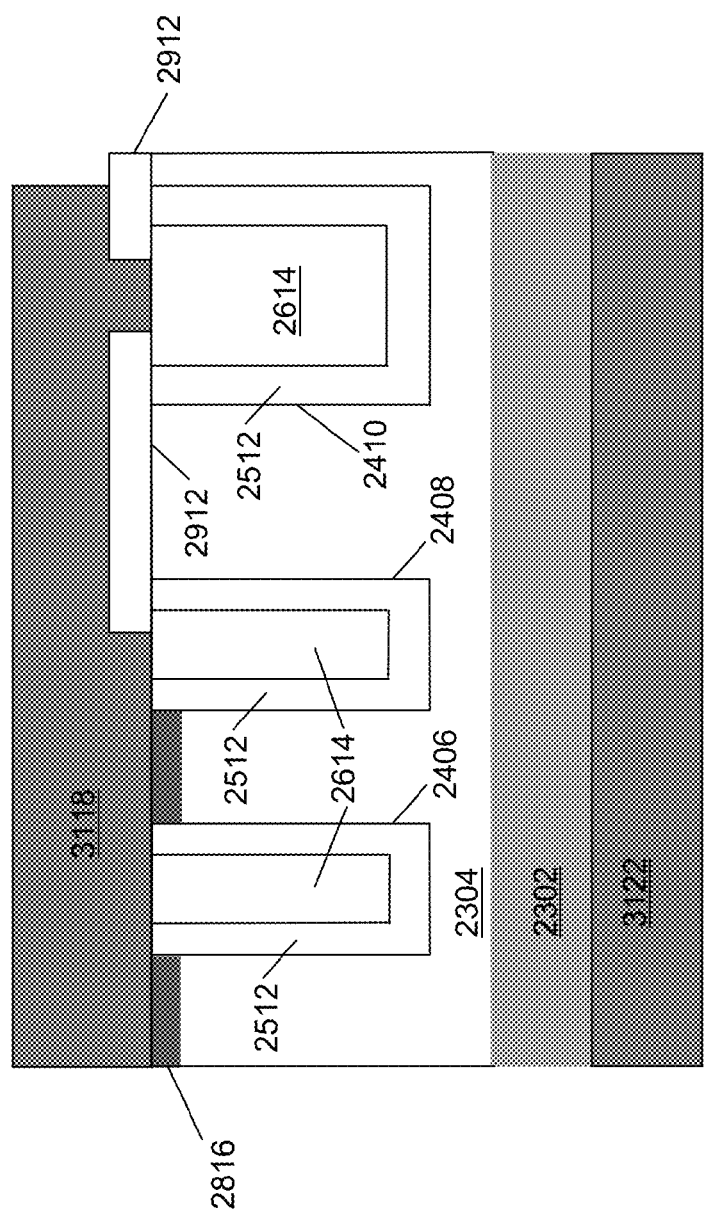

At operation 2218 of FIG. 22, a top metal (e.g., 818, 918, 1018, or 1118) can be formed on or above the contact regions and the etched second dielectric layer. Note that operation 2218 can be implemented in a wide variety of ways. For example, in an embodiment, FIG. 31 illustrates a top metal 3118 formed on or above the contact regions 3002 and the etched second dielectric layer 2912 at operation 2218. It is pointed out that in various embodiments, the top metal at operation 2218 can be referred to as an anode metal or a cathode metal. Operation 2218 can be implemented in any manner similar to that described herein, but is not limited to such.

At operation 2220, a bottom metal (e.g., 822, 922, 1022, or 1122) can be formed on the backside of the substrate. It is noted that operation 2220 can be implemented in a wide variety of ways. For example, in an embodiment, FIG. 31 illustrates a bottom metal 3122 formed below and on the backside of the substrate 2302 at operation 2220. It is pointed out that in various embodiments, the bottom metal at operation 2220 can be referred to as an anode metal or a cathode metal. Note that operation 2220 can be implemented in any manner similar to that described herein, but is not limited to such. Once operation 2220 is completed, process 2200 can be ended or exited. In this manner, a high voltage diode (e.g., 800, 900, 1000, or 1100) can be fabricated in accordance with various embodiments of the invention.

The foregoing descriptions of various specific embodiments in accordance with the invention have been presented for purposes of illustration and description. They are not intended to be exhaustive or to limit the invention to the precise forms disclosed, and many modifications and variations are possible in light of the above teaching. The invention is to be construed according to the Claims and their equivalents.

What is claimed is:

1. A breakdown voltage blocking device comprising:
   an epitaxial region located above a substrate;
   a first trench and a second trench formed in said epitaxial region, each of said first and second trenches comprising a dielectric layer surrounding and covering a conductive region, a first mesa formed by said first and second trenches;
   a first contact region located in an upper surface of said first mesa;
   a second contact region located in an upper surface of said epitaxial region and located adjacent to said first trench;
   a third trench formed in said epitaxial region, said third trench comprising a dielectric layer that lines the sidewalls and bottom of said third trench and a conductive region located between said dielectric layer, a second mesa formed by said second and third trenches, said second mesa is free of a contact region;
   a dielectric layer formed over said second mesa and contacting said dielectric layer of said second trench and said dielectric layer of said third trench;
   a first metal formed over said first and second trenches and said first and second contact regions; and
   a second metal formed over said third trench.

2. The breakdown voltage blocking device of claim 1, wherein said first and second contact regions comprise Schottky contacts.

3. The breakdown voltage blocking device of claim 1, wherein said first and second contact regions comprise ohmic contacts.

4. The breakdown voltage blocking device of claim 1, further comprising:
   a p-n junction.

5. The breakdown voltage blocking device of claim 1, further comprising:
   a doped region located below said second contact region.

6. The breakdown voltage blocking device of claim 1, wherein said substrate comprising an N+ type dopant, said epitaxial region comprising an N− type dopant, and said first and second contact regions each comprising an N+ type dopant.

7. The breakdown voltage blocking device of claim 1, wherein said substrate comprising a P+ type dopant, said epitaxial region comprising a P− type dopant, and said first and second contact regions each comprising a P+ type dopant.

8. The breakdown voltage blocking device of claim 1, wherein said third trench is wider than each of said first and second trenches.

9. The breakdown voltage blocking device of claim 1, wherein said conductive region of said third trench is wider than each of said conductive region of said first and second trenches.

10. A circuit comprising:
    a metal oxide semiconductor field effect transistor (MOSFET) device; and
    a breakdown voltage blocking device coupled to said MOSFET device, said breakdown voltage blocking device comprising:
    an epitaxial region located above a substrate;
    a first trench and a second trench formed in said epitaxial region, each of said first and second trenches comprising a dielectric layer surrounding and formed over a conductive region, a first mesa formed by said first and second trenches;
    a first contact region located in an upper surface of said first mesa;
    a second contact region located in an upper surface of said epitaxial region and located adjacent to said first trench;
    a third trench formed in said epitaxial region, said third trench comprising a dielectric layer that lines the sidewalls and bottom of said third trench and a conductive region located between said dielectric layer, a second mesa formed by said second and third trenches, said second mesa is free of a contact region;
    a dielectric layer formed over said second mesa and contacting said dielectric layer of said second trench and said dielectric layer of said third trench;

a first metal formed over said first and second trenches and said first and second contact regions; and a second metal formed over said third trench.

11. The circuit of claim 10, wherein said breakdown voltage blocking device further comprising a terminal coupled to a source terminal of said MOSFET device.

12. The circuit of claim 10, wherein said breakdown voltage blocking device further comprising a terminal coupled to a drain terminal of said MOSFET device.

13. The circuit of claim 10, wherein said MOSFET device is a power MOSFET device.

14. The circuit of claim 10, wherein said first and second contact regions comprise Schottky contacts.

15. The circuit of claim 10, wherein said first and second contact regions comprise ohmic contacts.

16. The circuit of claim 10, further comprising:

a p-n junction.

17. A breakdown voltage blocking device comprising:

an epitaxial region located above a substrate;

a first trench and a second trench formed in said epitaxial region, each of said first and second trenches comprising a dielectric layer encasing a conductive region, a first mesa formed by said first and second trenches;

a first contact region located in an upper surface of said first mesa;

a second contact region located in an upper surface of said epitaxial region and located adjacent to said first trench;

a third trench formed in said epitaxial region, said third trench comprising a dielectric layer that lines the sidewalls and bottom of said third trench and a conductive region located between said dielectric layer, a second mesa formed by said second and third trenches, said second mesa is free of a contact region;

a dielectric layer formed over said second mesa and contacting said dielectric layer of said second trench and said dielectric layer of said third trench;

a first metal formed over said first and second trenches and said first and second contact regions; and a second metal formed over said third trench;

said breakdown voltage blocking device is operable to block more voltage the greater the depth of said first, second and third trenches.

18. The breakdown voltage blocking device of claim 17, wherein the breakdown voltage blocking device blocks more voltage the greater the thickness of the dielectric layer of said first, second and third trenches.

19. The breakdown voltage blocking device of claim 17, wherein the breakdown voltage blocking device blocks more voltage the greater the thickness of the epitaxial region located between the substrate and the bottom of said first, second and third trenches.

20. The breakdown voltage blocking device of claim 17, wherein said conductive region of said third trench is wider than each of said conductive region of said first and second trenches.

* * * * *